(12) United States Patent
Hoshino et al.

(10) Patent No.: US 8,367,466 B2
(45) Date of Patent: Feb. 5, 2013

(54) MANUFACTURING STACKED SEMICONDUCTOR DEVICE

(75) Inventors: Masataka Hoshino, Kanagawa (JP); Junichi Kasai, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 121 days.

(21) Appl. No.: 12/210,113

(22) Filed: Sep. 12, 2008

(65) Prior Publication Data

US 2009/0230533 A1 Sep. 17, 2009

(30) Foreign Application Priority Data

Sep. 14, 2007 (JP) .................................. 2007-238877

(51) Int. Cl.
*H01L 21/00* (2006.01)
(52) U.S. Cl. ................. 438/107; 257/686; 257/E21.499
(58) Field of Classification Search ................... 438/109, 438/107; 257/686, E21.499
See application file for complete search history.

(56) References Cited

U.S. PATENT DOCUMENTS

| | | | |
|---|---|---|---|
| 5,571,754 A | 11/1996 | Bertin et al. | |
| 6,765,299 B2 | 7/2004 | Takahashi et al. | |
| 7,413,925 B2 | 8/2008 | Egawa | |
| 7,791,186 B2 | 9/2010 | Kikuchi et al. | |
| 7,843,059 B2 * | 11/2010 | Gomyo et al. | 257/723 |
| 7,944,058 B2 | 5/2011 | Ishihara | |
| 2002/0126459 A1* | 9/2002 | Albert et al. | 361/743 |
| 2003/0017647 A1* | 1/2003 | Kwon et al. | 438/109 |
| 2004/0262712 A1* | 12/2004 | Doi | 257/536 |
| 2006/0022332 A1* | 2/2006 | Koyama et al. | 257/723 |
| 2006/0113598 A1* | 6/2006 | Chen et al. | 257/347 |
| 2009/0278246 A1* | 11/2009 | Hoshino et al. | 257/686 |

FOREIGN PATENT DOCUMENTS

| | | |
|---|---|---|
| JP | 7183455 | 7/1995 |
| JP | 8306724 | 11/1996 |
| JP | 9045848 | 2/1997 |
| JP | 2001-257310 | 3/2000 |
| JP | 2000-293650 | 10/2000 |
| JP | 2000293650 | 10/2000 |
| JP | 2001250836 | 9/2001 |
| JP | 2001257310 | 9/2001 |
| JP | 2005-136187 | 10/2003 |
| JP | 2005136187 | 10/2003 |
| JP | 2006-140392 | 6/2006 |
| JP | 2006140392 | 6/2006 |
| JP | 2007109802 | 4/2007 |
| JP | 2007214220 | 8/2007 |

OTHER PUBLICATIONS

Kurita et al, Smafti Package with Wide-Band/High Capacity memory, 2006, NEC Technology, vol. 59, No. 5/2006, pp. 46-49.*

* cited by examiner

*Primary Examiner* — William D Coleman
*Assistant Examiner* — Christine Enad

(57) ABSTRACT

A method in accordance with an embodiment of the invention can include forming fan-out wirings on an insulating layer formed on a wafer. Additionally, electrodes of a plurality of semiconductor chips stacked on the fan-out wirings can be electrically coupled with the fan-out wirings. The wafer can be removed.

20 Claims, 38 Drawing Sheets

MANUFACTURING STACKED SEMICONDUCTOR DEVICE

CROSS-REFERENCE TO RELATED APPLICATIONS

This patent application claims the benefit and priority of the co-pending Japanese Patent Application No. 2007-238877, filed on Sep. 14, 2007, which is hereby incorporated by reference in its entirety.

BACKGROUND

Semiconductor devices are currently found in a wide variety of items, such as, automobiles, Global Positioning System (GPS) devices, large and small computers or computing devices, mobile phones, MP3 players, DVD players, and the like. It is noted that semiconductor devices can be manufactured in a wide variety of ways. For example, one conventional technique for manufacturing a semiconductor device involves utilizing a process of stacking semiconductor chips. However, it is pointed out that there are disadvantages associated with the process of stacking semiconductor chips. For example, one of the disadvantages is that it can be a time consuming process.

Processes of manufacturing a semiconductor package 100 as disclosed in Non-Patent Document 1 (NEC Technical Journal, vol. 59, No. 5/2006, pgs. 46-49) are shown in FIG. 43 through FIG. 46. These manufacturing processes are all carried out in a wafer state. In FIG. 43, a wiring body 104 is formed on a silicon (Si) wafer 101 serving as a support body by using copper (Cu) wirings 102 and a polyimide insulating film 103. In FIG. 44, a memory TEG chip 106 formed with solder-plated bumps 105 is bonded on the wiring body 104 by a flip-chip bonder. Then, a surface of the Si wafer 101 onto which the memory TEG chip 106 is bonded is sealed by a resin layer 107 through a compression molding technique. In FIG. 45, a wiring pattern of the wiring body 104 is exposed by removing the Si wafer 101 serving as a support body. In FIG. 46, a logic TEG chip 108 is bonded on the wiring body 104, and the bonding portion is sealed by an underfill resin 109. Finally, solder balls 110 are bonded on pads formed in the wiring body 104, and individual packages are obtained by dicing.

However, in the Non-Patent Document 1, after the memory TEG chip 106 in one layer is bonded on a surface of the wiring body 104, the logic TEG chip 108 in one layer is bonded on a rear surface of the wiring body 104. In this case, chip bonding must be carried out at least twice with respect to the wiring body 104, which creates a problem that it is impossible to simplify and reduce the time required by the chip bonding process.

Since chip bonding is carried out on both surfaces of the wiring body 104, Cu wirings 102 must be formed in such a way as to reliably penetrate the polyimide insulating film 103. Thus, a problem occurs that it is impossible to simplify and reduce the time required by the process of manufacturing the wiring body 104.

SUMMARY

A method for manufacturing a semiconductor device in accordance with one embodiment of the invention can simplify and reduce the time associated with the process of stacking semiconductor chips.

For example in an embodiment, a method can include forming fan-out wirings on an insulating layer formed on a wafer. Additionally, electrodes of a plurality of semiconductor chips stacked on the fan-out wirings can be electrically coupled to the fan-out wirings. The wafer can then be removed.

In one embodiment, the forming of the fan-out wirings can include forming wirings on an insulating layer formed on a wafer. The fan-out wirings have the role of leading out the wirings from the pads of the semiconductor chip, and makes it possible to extend the pitch between electrodes to bond the solder balls, etc. The fan-out wirings can be formed on the wafer at the same time (or about the same time) with respect to each one of a plurality of packages by using a wafer process. In an embodiment, the coupling can include a plurality of semiconductor chips being stacked on the respective fan-out wirings. Each one of the electrodes of the stacked semiconductor chips and the fan-out wirings are electrically coupled. In one embodiment, regarding the removal of the wafer, a package in which the plurality of semiconductor chips are electrically bonded on the fan-out wirings is completed by removing the wafer and leaving the insulating layer. As a result, a plurality of semiconductor chips can be stacked on one surface of the insulating layer, so that they can be collectively bonded. This makes it possible to simplify and reduce the time associated with the chip bonding process.

Since the semiconductor chips are stacked, each one of the electrodes of the plurality of semiconductor chips and the fan-out wirings can be arranged on the same axis in the stacking direction. Thus, the electrodes of the semiconductor chips and the fan-out wirings can all be connected or coupled at the same time in one process, which makes it possible to further simplify and reduce the time associated with the chip bonding process.

In accordance with various embodiments of the invention, semiconductor chip bonding can be carried out in the state that a plurality of fan-out wirings are formed on the wafer. Here, since the use of the wafer process is made possible, a dedicated jig or dedicated device is no longer used, which thus helps reduce costs. Also, since calibration, etc. of coordinate position may be carried out in terms of wafer units, the process efficiency can be improved.

A manufacturing method of a semiconductor device according to one embodiment of the invention can include forming an insulating layer on a wafer. Electrodes of a plurality of semiconductor chips that are stacked on the insulating layer can be electrically coupled with each other. Lead-out wirings from a semiconductor chip can be formed in an uppermost layer in a vertically upward direction of the wafer. The wafer can then be removed.

The forming of the insulating layer on the wafer can include an insulating layer serving as a support body of the semiconductor chip that is formed on the wafer. Note that the electrically coupling of the electrodes can include a plurality of semiconductor chips being stacked on the insulating layer. Then, the electrodes of the stacked semiconductor chips are respectively electrically coupled or connected with each other. The forming of the lead-out wirings can include lead-out wirings being formed in a vertically upward direction from the semiconductor chip in the uppermost layer. The lead-out wirings have the role of leading out the wirings from the stacked semiconductor chips, and make it possible to extend the pitch between electrodes to thereby bond the solder balls, etc. It is thus possible to form the lead-out wirings at the same time (or about the same time) on the wafer, with respect to each of a plurality of packages, by using a wafer process. It is noted that a package having the lead-out wirings can be completed by removing the wafer and leaving the insulating layer.

As described above, a plurality of semiconductor chips can be stacked on an upper surface of the insulating layer to form lead-out wirings upward in the stacking direction. As a result, since wirings are no longer formed that penetrate the insulating layer and extend to a lower surface of the insulating layer, the insulating layer can have the role of serving as a support body of the semiconductor chips. As a result, it is possible to reduce the number of wiring processes and the time associated with these processes.

While particular embodiments in accordance with the invention have been specifically described within this Summary, it is noted that the invention is not limited to these embodiments. The invention is intended to cover alternatives, modifications and equivalents which may be included within the scope of the invention as recited by the Claims.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

The manufacturing method of a stacked-type semiconductor package 1 (FIG. 25) according to an embodiment of the invention will be described while referring to FIG. 1 through FIG. 25. It is noted that this embodiment relates to stacking and bonding semiconductor chips having side-wall electrodes. The case in which semiconductor chips 20a through 20c are stacked is described as an example.

Figure 1:
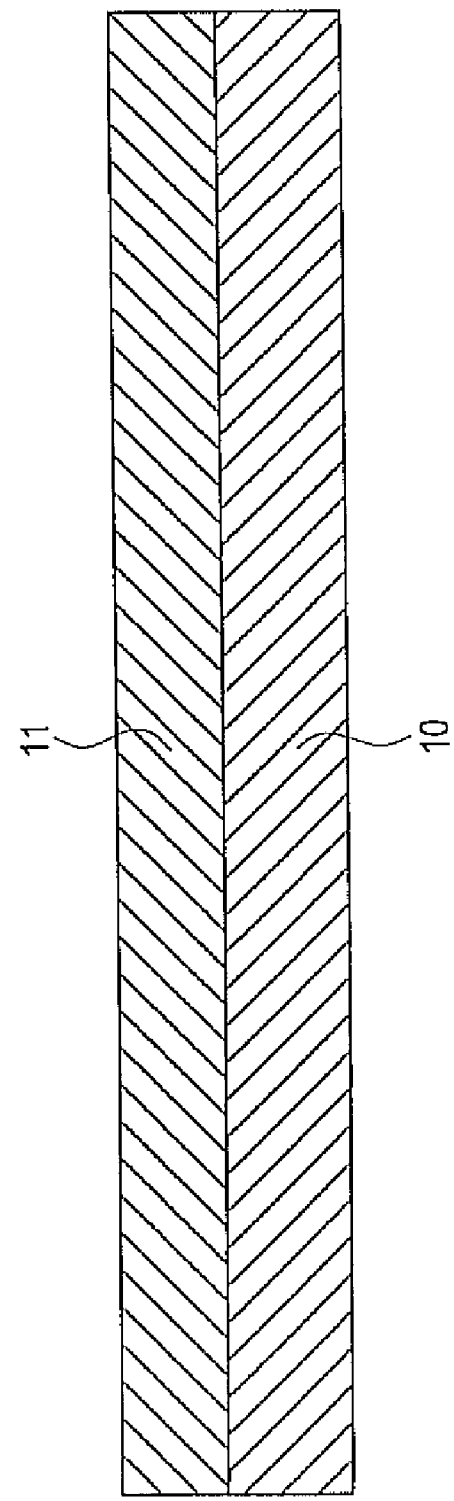
FIG. 1 is a cross-section diagram showing a process of manufacturing fan-out wirings in accordance with various embodiments of the invention.

First, the manufacturing process of fan-out wirings onto which the semiconductor chips are mounted will be described using the cross-section diagrams in FIG. 1 through FIG. 7. As shown in FIG. 1, an insulating layer 11 can be formed on a wafer 10. The insulating layer 11 can be formed by spin coating an insulating resin. The insulating resin can include insulating organic resins such as a polyimide resin or an epoxy resin, etc. that are generally used to manufacture semiconductor devices. In one embodiment, the insulating layer 11 may be a silicon dioxide film formed by the CVD (chemical vapor deposition) method, but is not limited to such.

Figure 2:
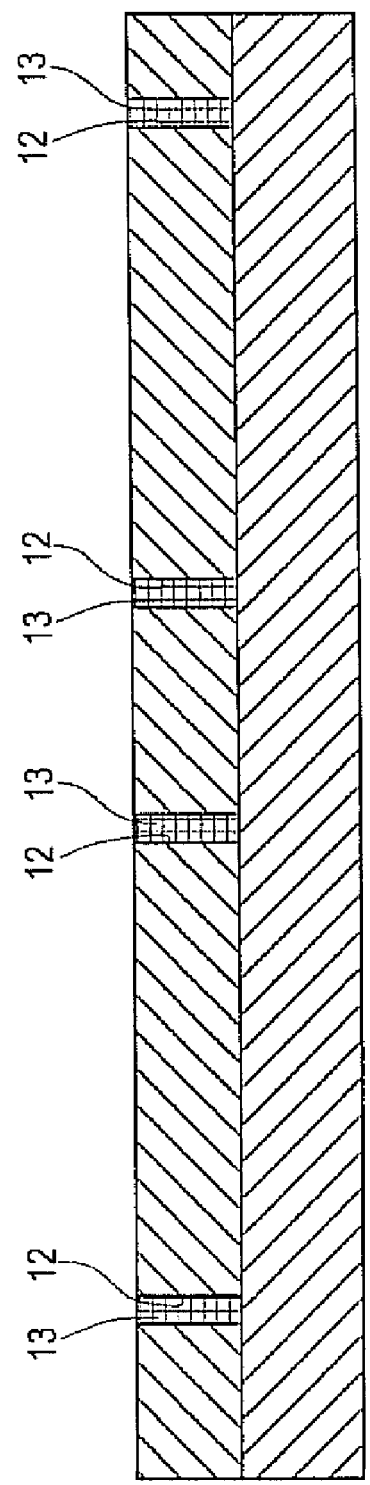
FIG. 2 is a cross-section diagram showing a process of manufacturing fan-out wirings in accordance with various embodiments of the invention.

As shown in FIG. 2, through holes 12 extending from the surface of the insulating layer 11 up to the wafer 10 can be formed in the insulating layer 11. Through holes 12 can be formed by a photolithography technique and an etching technique, similar with the wafer process technique. Then, wirings 13 can be formed in through holes 12. Wirings 13 can be formed by filling the through holes 12 with a Cu plating film by using, for instance, an electrolytic plating method to be described later.

Figure 3:
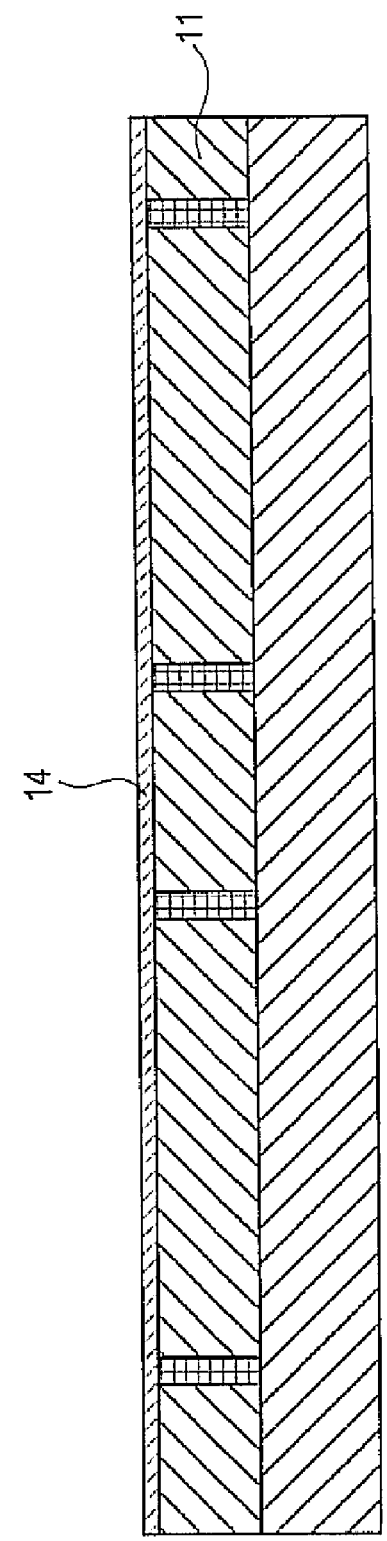
FIG. 3 is a cross-section diagram showing a process of manufacturing fan-out wirings in accordance with various embodiments of the invention.

As shown in FIG. 3, a seed metal layer 14 can be formed on the entire surface of the insulating film 11 through sputtering, but is not limited to such.

Figure 4:
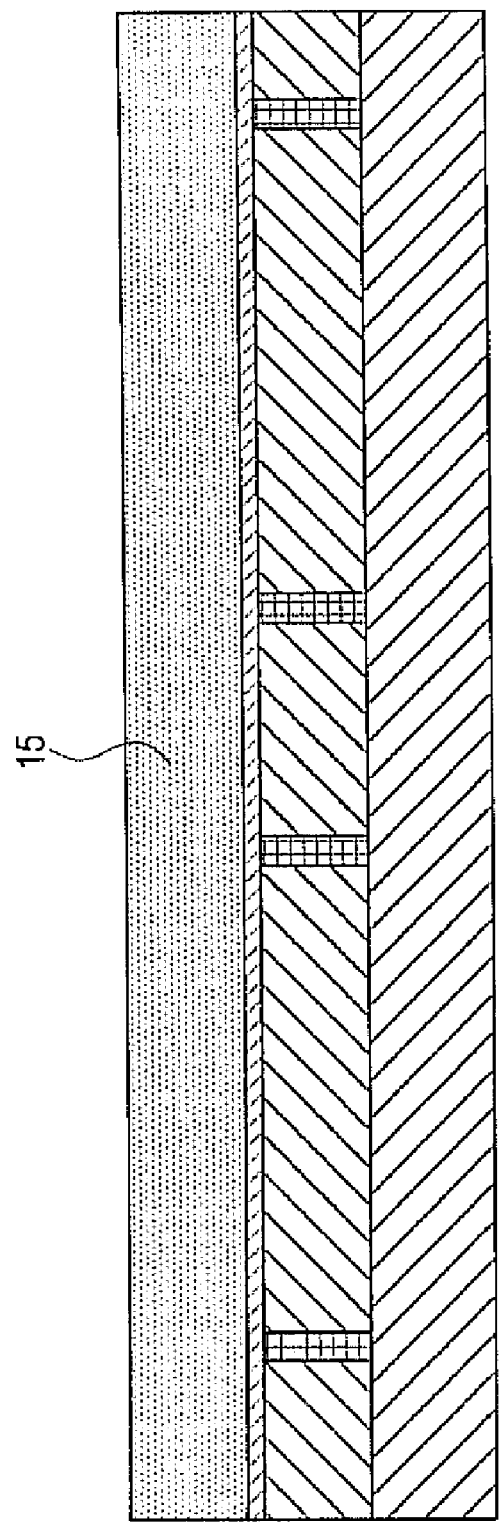
FIG. 4 is a cross-section diagram showing a process of manufacturing fan-out wirings in accordance with various embodiments of the invention.

As shown in FIG. 4, a photoresist layer 15 can be formed on the entire surface of the insulating layer 11, but is not limited to such.

Figure 5:
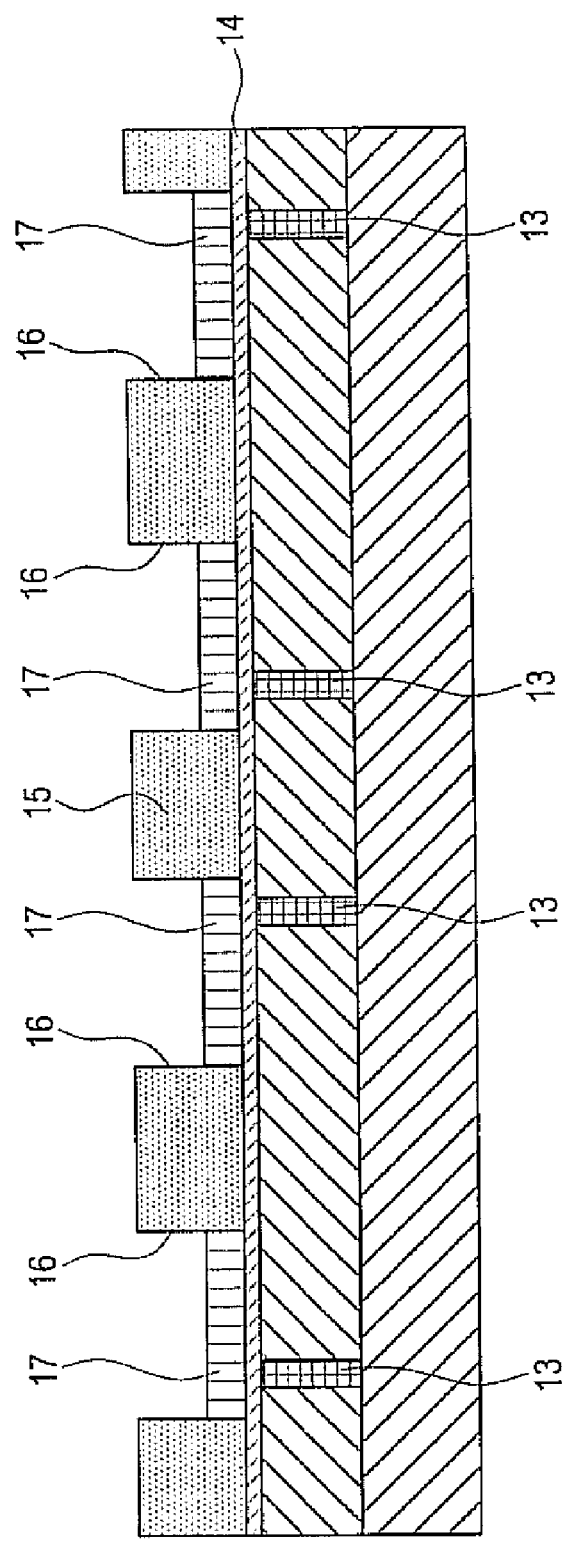
FIG. 5 is a cross-section diagram showing a process of manufacturing fan-out wirings in accordance with various embodiments of the invention.

As shown in FIG. 5, the photoresist layer 15 is removed at regions 16 where rewiring portions are to be formed, by photolithography, but is not limited to such. The regions 16 are formed so as to respectively house the wirings 13 in a vertically downward direction (e.g., downward direction on the sheet). Then, Cu plating can be carried out on the seed metal layer 14 at regions 16 by electrolytic plating. As a result, rewiring portions 17 can be formed.

Figure 6:
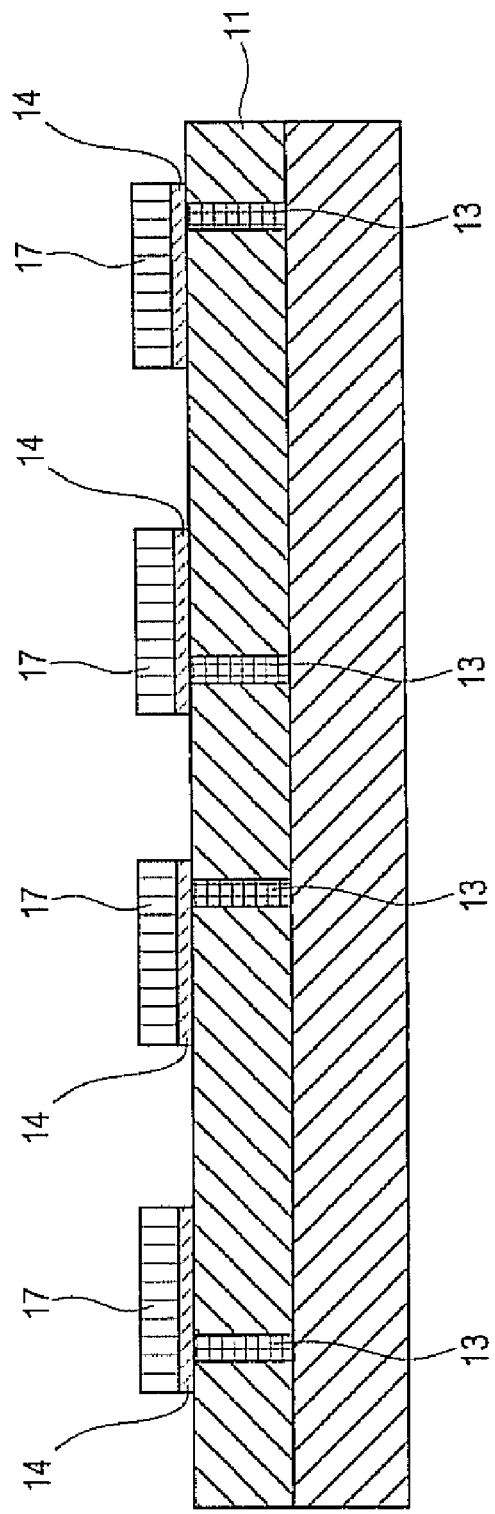
FIG. 6 is a cross-section diagram showing a process of manufacturing fan-out wirings in accordance with various embodiments of the invention.

As shown in FIG. 6, the photoresist layer 15 can be removed. Then, the seed metal layer 14 can be removed at portions where the rewiring portions 17 are not formed, through etching, but is not limited to such.

Figure 7:
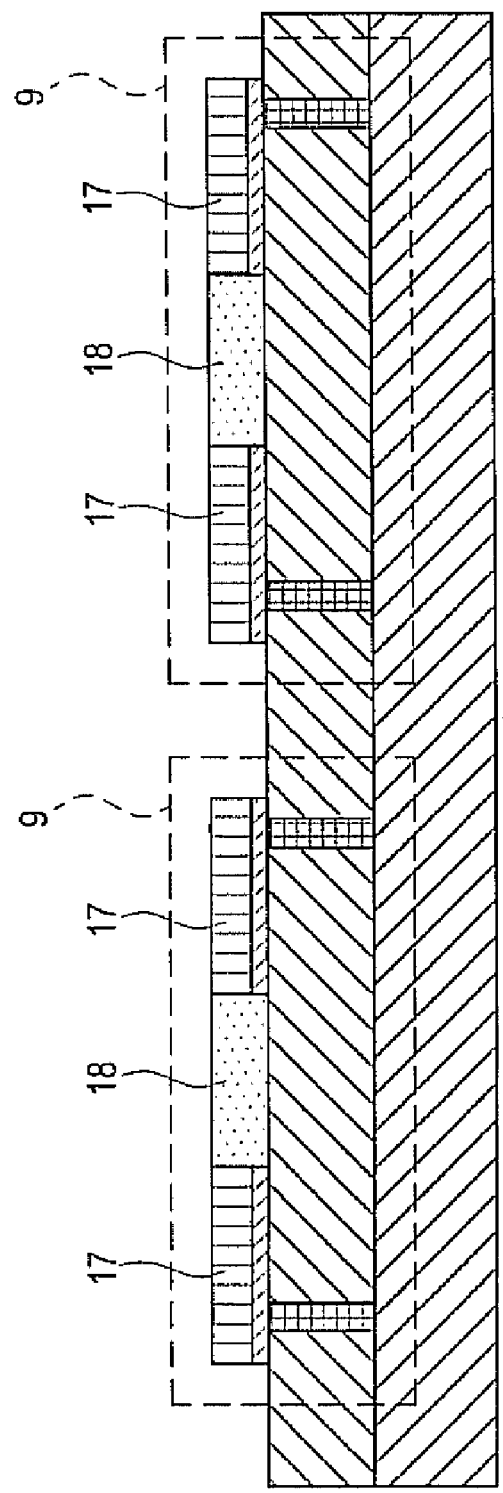
FIG. 7 is a cross-section diagram showing a process of manufacturing fan-out wirings in accordance with various embodiments of the invention.

As shown in FIG. 7, in the spaces between the rewiring portions 17, the portions where the semiconductor chips are stacked can be filled with DAF (Die Attach Film) material 18, wherein the portions and the DAF material 18 can be bonded by a polyimide adhesive. Here, this process may be omitted. As a result, fan-out wirings 9 consisting of wirings 13 and rewiring portions 17 are formed in the insulating layer 11. In FIG. 7, two similar fan-out wirings 9 can be formed at the same time (or at about the same time).

Figure 8:
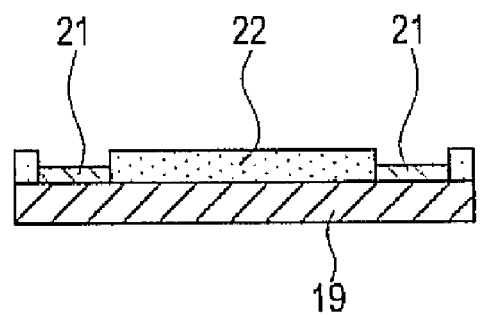
FIG. 8 is a cross-section diagram showing a process of manufacturing side-wall electrodes of a semiconductor chip in accordance with various embodiments of the invention.

Next, the process of manufacturing the side-wall electrodes of the semiconductor chip 20 will be described using the cross-section diagrams shown in FIG. 8 through FIG. 15. In FIG. 8, various circuits can be formed on a surface of a bare chip 19. Pads 21 that can be connected or coupled with these various circuits can be formed on an upper surface of the bare chip 19. Then, a protective film 22 can be formed on the upper surface of the bare chip 19, except for pads 21. Since the manufacturing method of pads 21 and protective film 22 is similar to the manufacturing process of the above-described rewiring portions 17, a detailed description thereof is hereby omitted.

Figure 9:
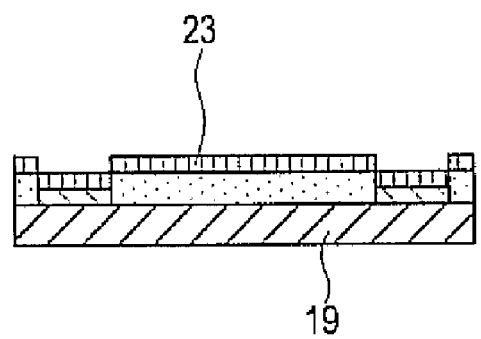
FIG. 9 is a cross-section diagram showing a process of manufacturing side-wall electrodes of the semiconductor chip in accordance with various embodiments of the invention.

As shown in FIG. 9, a seed metal layer 23 is formed on the upper surface of the bare chip 19 through sputtering, but is not limited to such.

Figure 10:
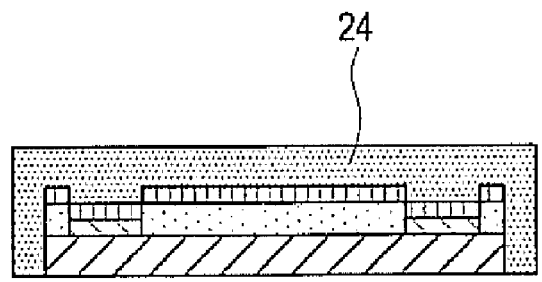
FIG. 10 is a cross-section diagram showing a process of manufacturing side-wall electrodes of the semiconductor chip in accordance with various embodiments of the invention.

As shown in FIG. 10, a photoresist layer 24 is formed on the upper surface and side surfaces of the bare chip 19.

Figure 11:
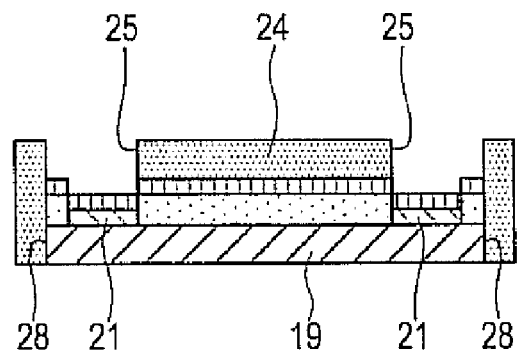
FIG. 11 is a cross-section diagram showing a process of manufacturing side-wall electrodes of the semiconductor chip in accordance with various embodiments of the invention.

As shown in FIG. 11, the photoresist layer 24 is removed at regions 25 where the side-wall electrodes are to be formed, by photolithography, but is not limited to such. Regions 25 are formed so that pads 21 exist in a vertically downward direction (e.g., downward direction on the sheet). From the side surfaces of the regions 25, the side surfaces at a peripheral side of the bare chip 19 can be formed so as to be coplanar with the chip side surfaces 28 of the bare chip 19.

Figure 12:
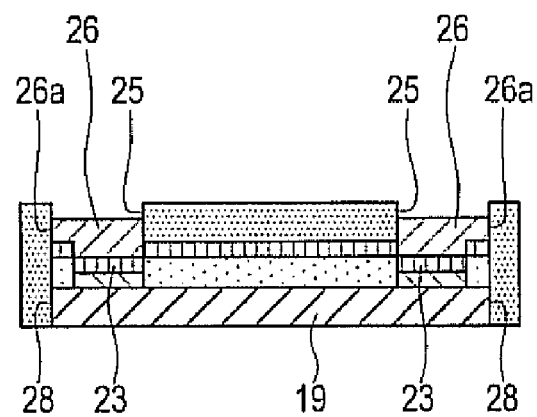
FIG. 12 is a cross-section diagram showing a process of manufacturing side-wall electrodes of the semiconductor chip in accordance with various embodiments of the invention.

As shown in FIG. 12, Cu plating can be performed on the seed metal layer 23 at regions 25 by electrolytic plating. As a result, side-wall electrodes 26 are formed.

Figure 13:
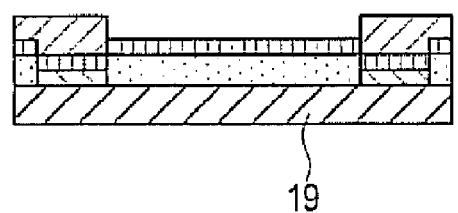
FIG. 13 is a cross-section diagram showing a process of manufacturing side-wall electrodes of the semiconductor chip in accordance with various embodiments of the invention.

As shown in FIG. 13, the photoresist layer 24 can be peeled off.

Figure 14:
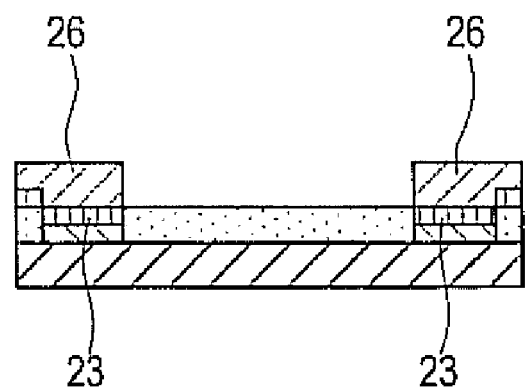
FIG. 14 is a cross-section diagram showing a process of manufacturing side-wall electrodes of the semiconductor chip in accordance with various embodiments of the invention.
Figure 15:
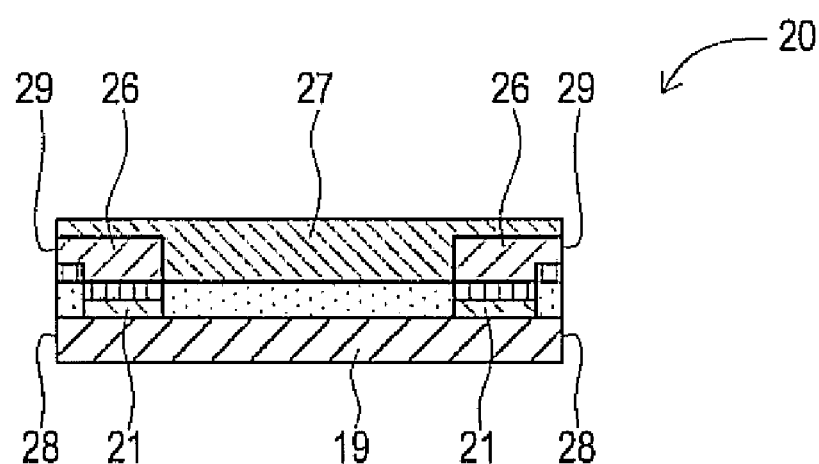
FIG. 15 is a cross-section diagram showing a process of manufacturing side-wall electrodes of the semiconductor chip in accordance with various embodiments of the invention.

As shown in FIG. 14, the seed metal layer 23 can be removed at the portions where the side-walls electrodes 26 are not formed, through etching, but is not limited to such. As shown in FIG. 15, the spaces between the side-wall electrodes 26 are filled with DAF material 27, wherein the spaces and the DAF material 27 are thus bonded by polyimide adhesive. Here, this process can be omitted. As a result, a semiconductor chip 20 is formed which has side-wall electrodes 26 formed so that electrode side-surfaces 29 are coplanar with the chip side surfaces 28. The pads 21 are therefore lead out up to the electrode side surfaces 29, by the side-wall electrodes 26.

Next, using the cross-section diagrams in FIG. 16 through FIG. 21, a description will be given on the process of stacking the semiconductor chips 20a through 20c on the rewiring portions 17 to thus form side-wall wirings 44 which commonly connect (or couple) all the side-wall electrodes 26a through 26c with the rewiring portions 17.

Figure 16:
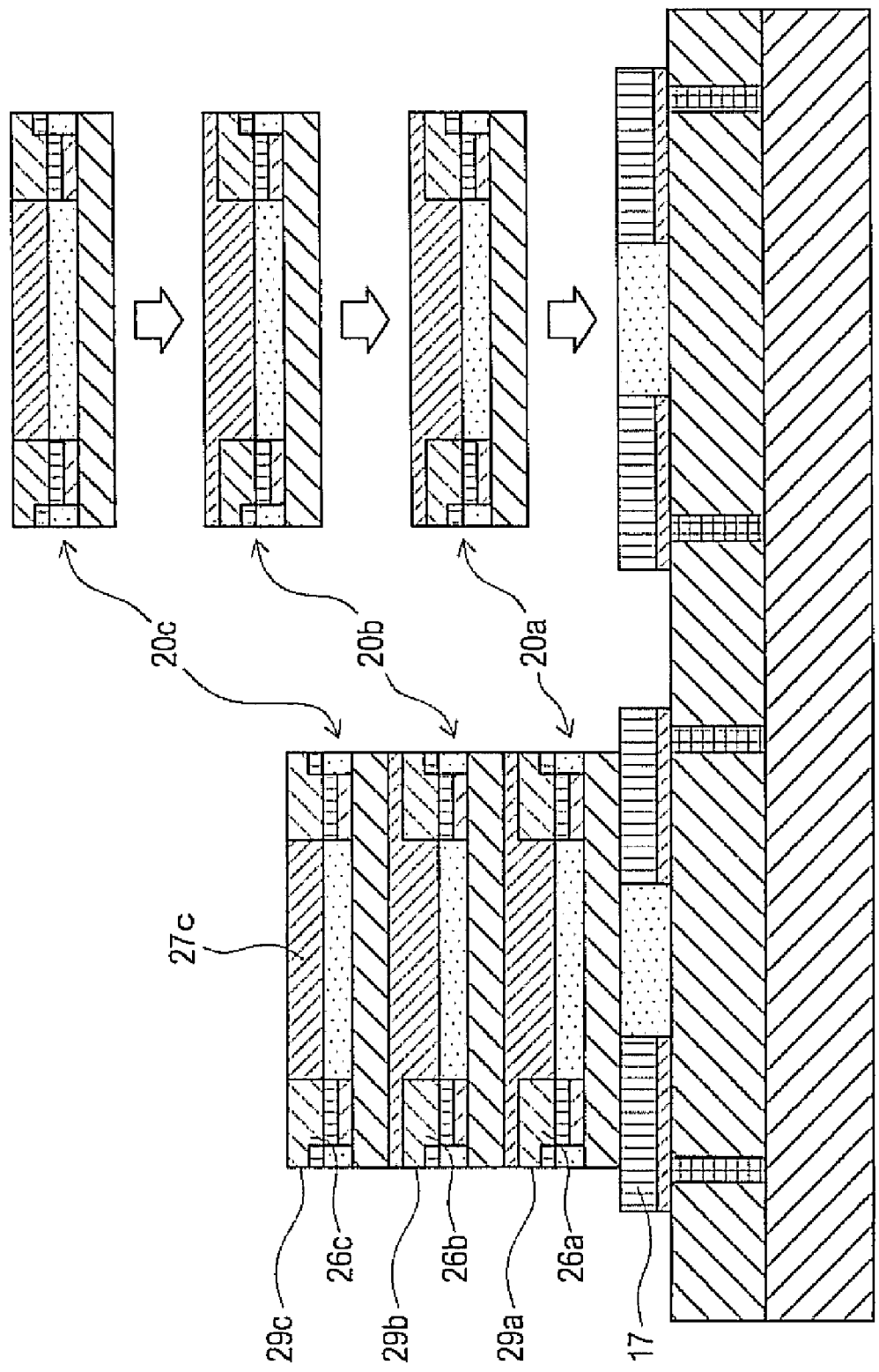
FIG. 16 is a cross-section diagram showing a process of forming side-wall wirings in accordance with various embodiments of the invention.

As shown in FIG. 16, the semiconductor chips 20a through 20c are stacked on the rewiring portions 17 using a die bonder, but is not limited to such. At this time, semiconductor chips 20a through 20c are stacked so that the electrode side surfaces 29a through 29c of the side-wall electrodes 26a through 26c are lined up in a vertically upward direction (e.g., upward direction on the sheet) of the rewiring portions 17. Since the DAF material 27c of the semiconductor chip 20c stacked on the uppermost portion is not formed so as to cover the upper surface of the side-wall electrode 26c, the upper surface of the side-wall electrode 26c is exposed.

Figure 17:
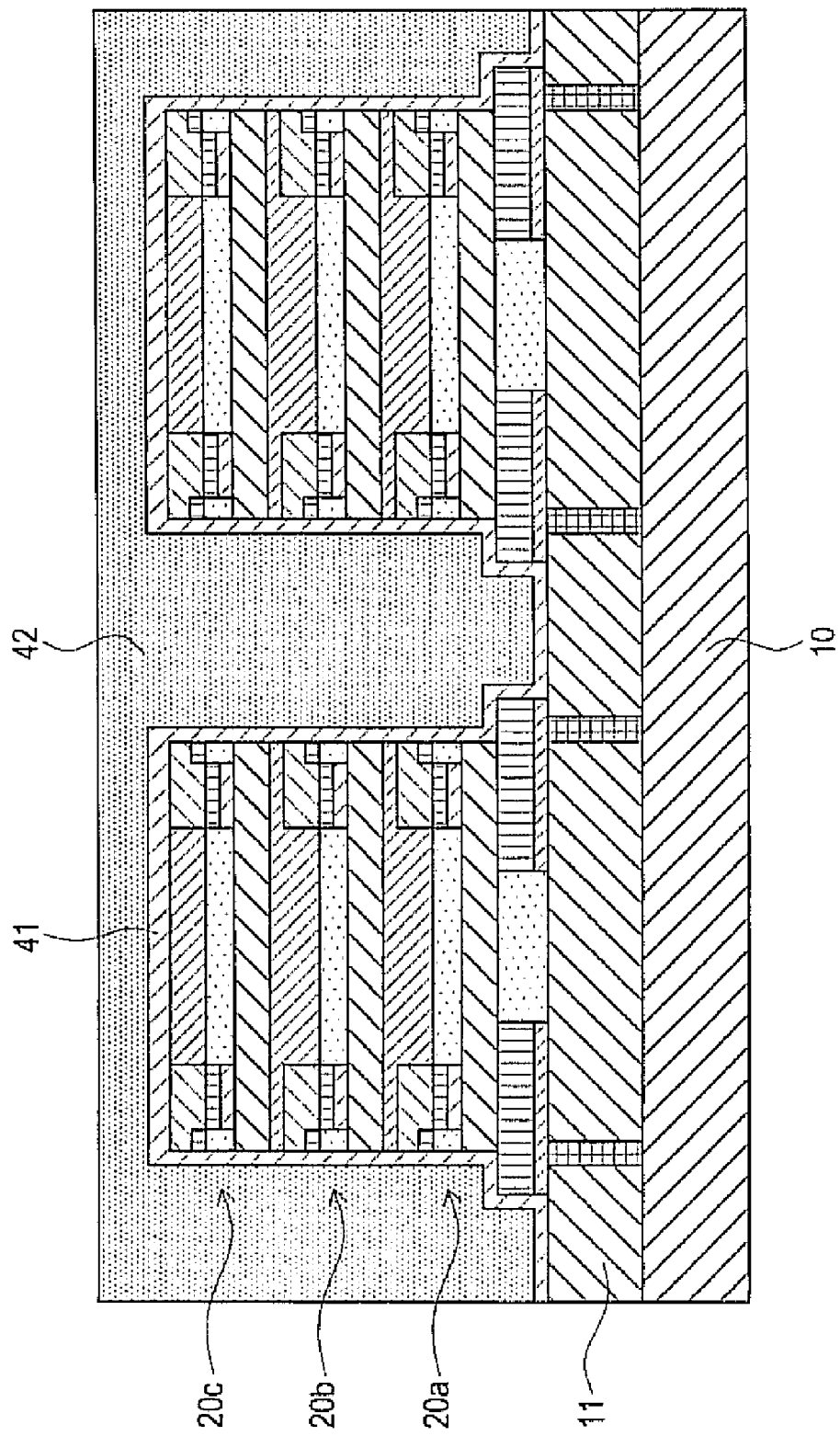
FIG. 17 is a cross-section diagram showing a process of forming side-wall wirings in accordance with various embodiments of the invention.

As shown in FIG. 17, the seed metal layer 41 can be formed on the surface of the wafer 10 on which semiconductor chips 20a through 20c are stacked. Then, a photoresist layer 42 that is thicker than the distance from the surface of the insulating layer 11 to the uppermost surface of the semiconductor chip 20c can be formed on the insulating layer 11.

Figure 18:
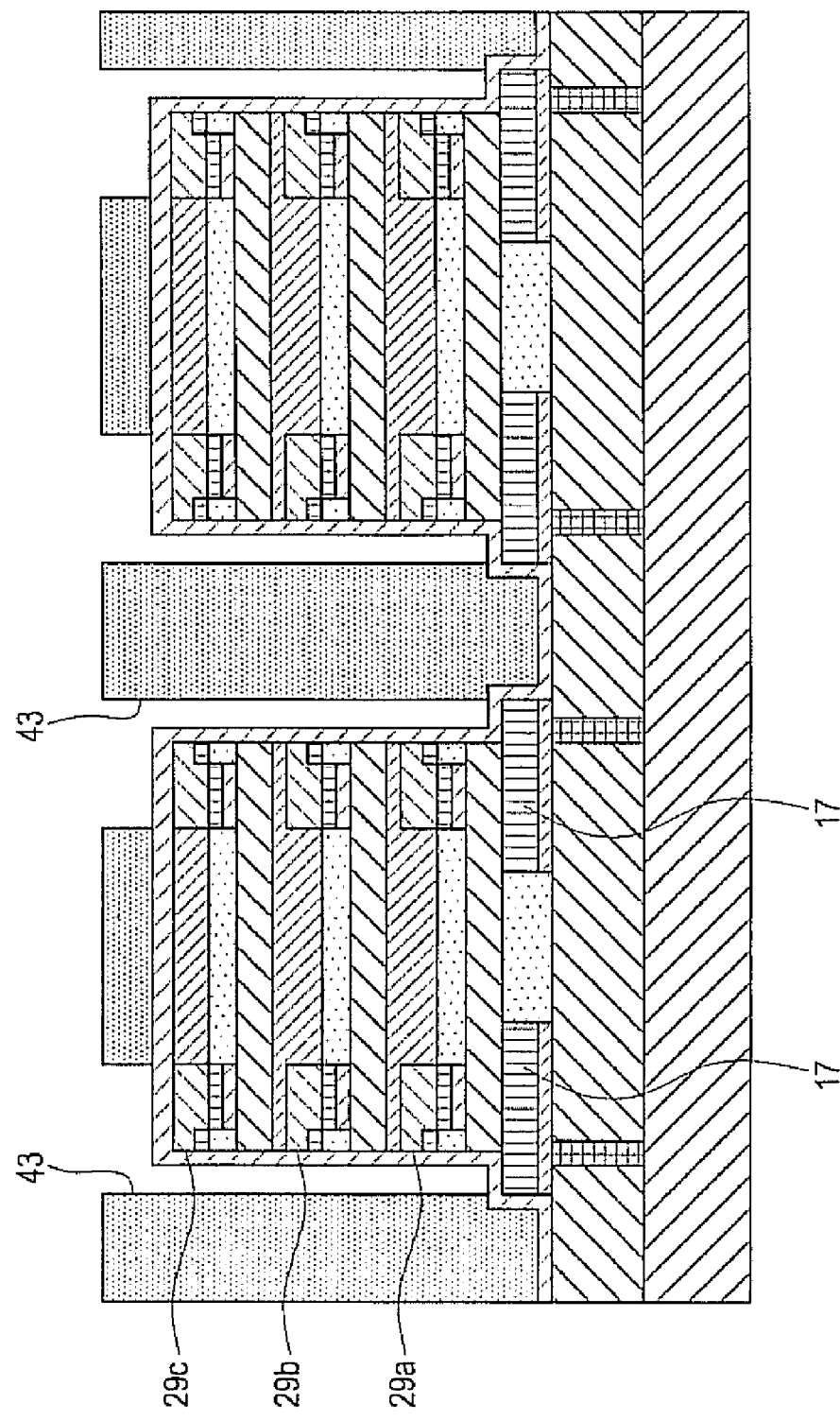
FIG. 18 is a cross-section diagram showing a process of forming side-wall wirings in accordance with various embodiments of the invention.

As shown in FIG. 18, opening portions 43 in which side-wall wirings will be formed can be formed through photolithography, but is not limited to such. The opening portions 43 can be formed so as to include electrode side surfaces 29a through 29c and extend up to the rewiring portions 17.

Figure 19:
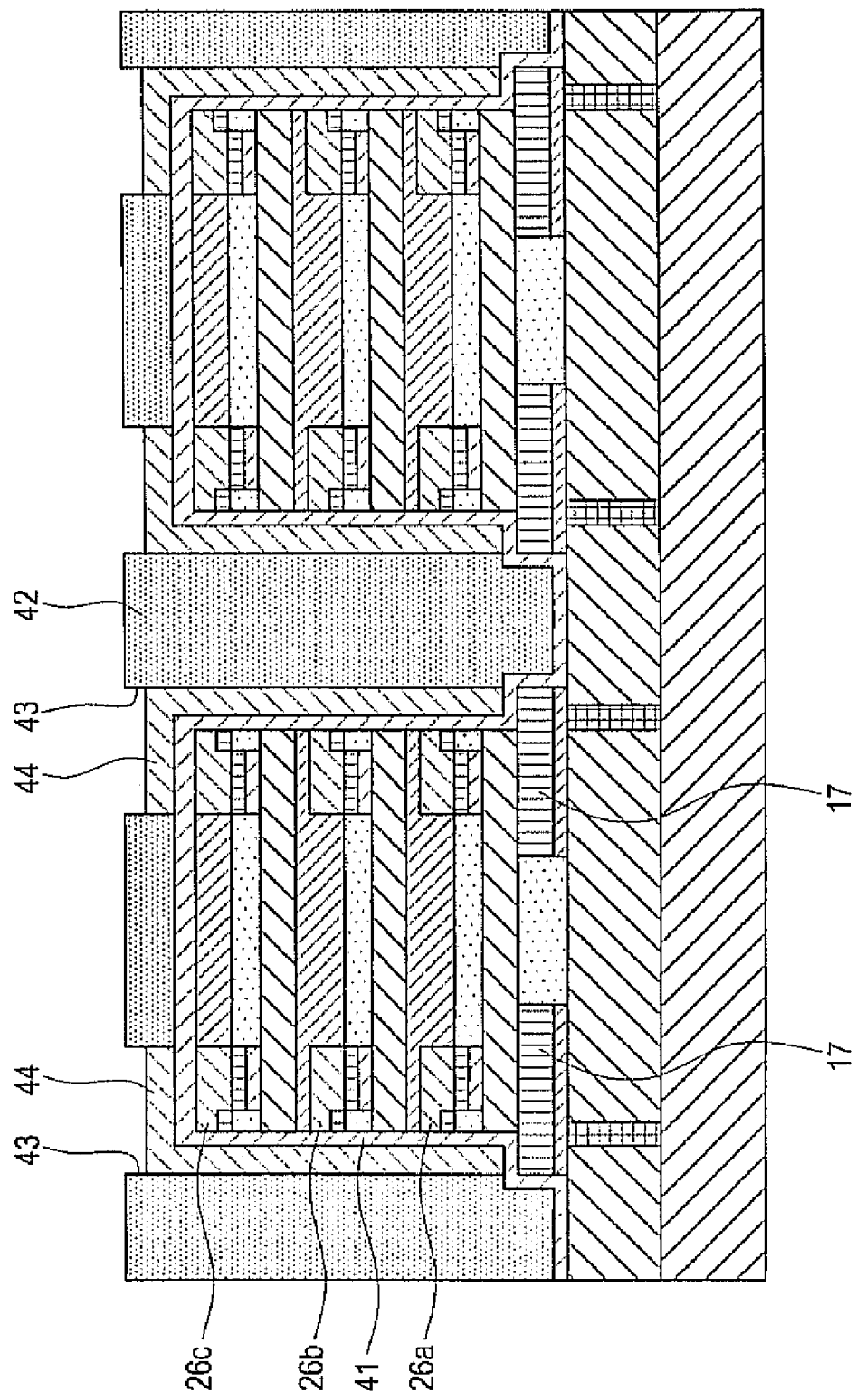
FIG. 19 is a cross-section diagram showing a process of forming side-wall wirings in accordance with various embodiments of the invention.

As shown in FIG. 19, Cu plating can be performed on the seed metal layer 41 inside the opening portions 43 by electrolytic plating, but is not limited to such. As a result, side-wall wirings 44 are formed inside the opening portions 43. It is noted that all the rewiring portions 17 and the side-wall electrodes 26a through 26c are electrically connected to each other by side-wall wirings 44.

Figure 20:
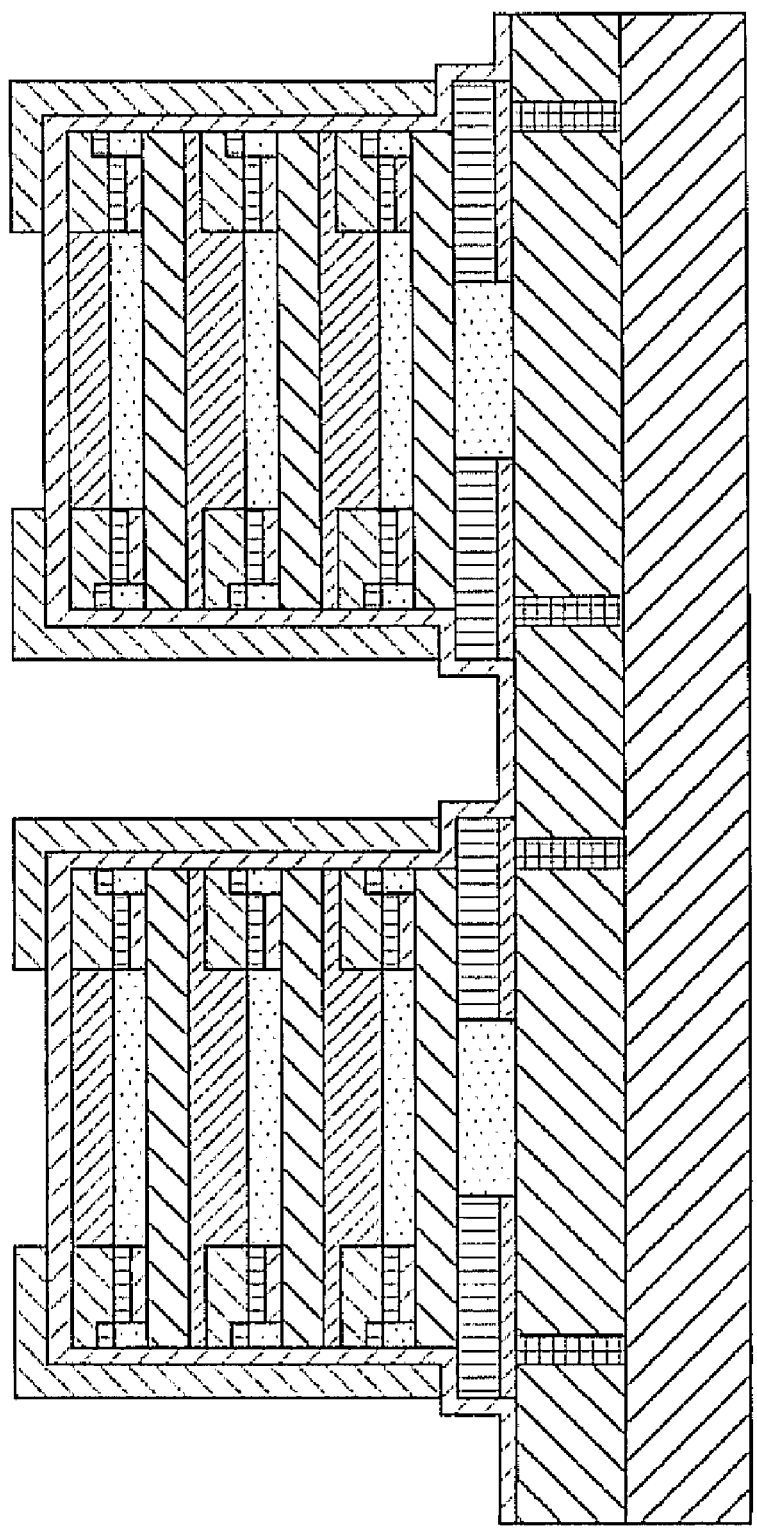
FIG. 20 is a cross-section diagram showing a process of forming side-wall wirings in accordance with various embodiments of the invention.

As shown in FIG. 20, the photoresist layer 42 is peeled off.

Figure 21:
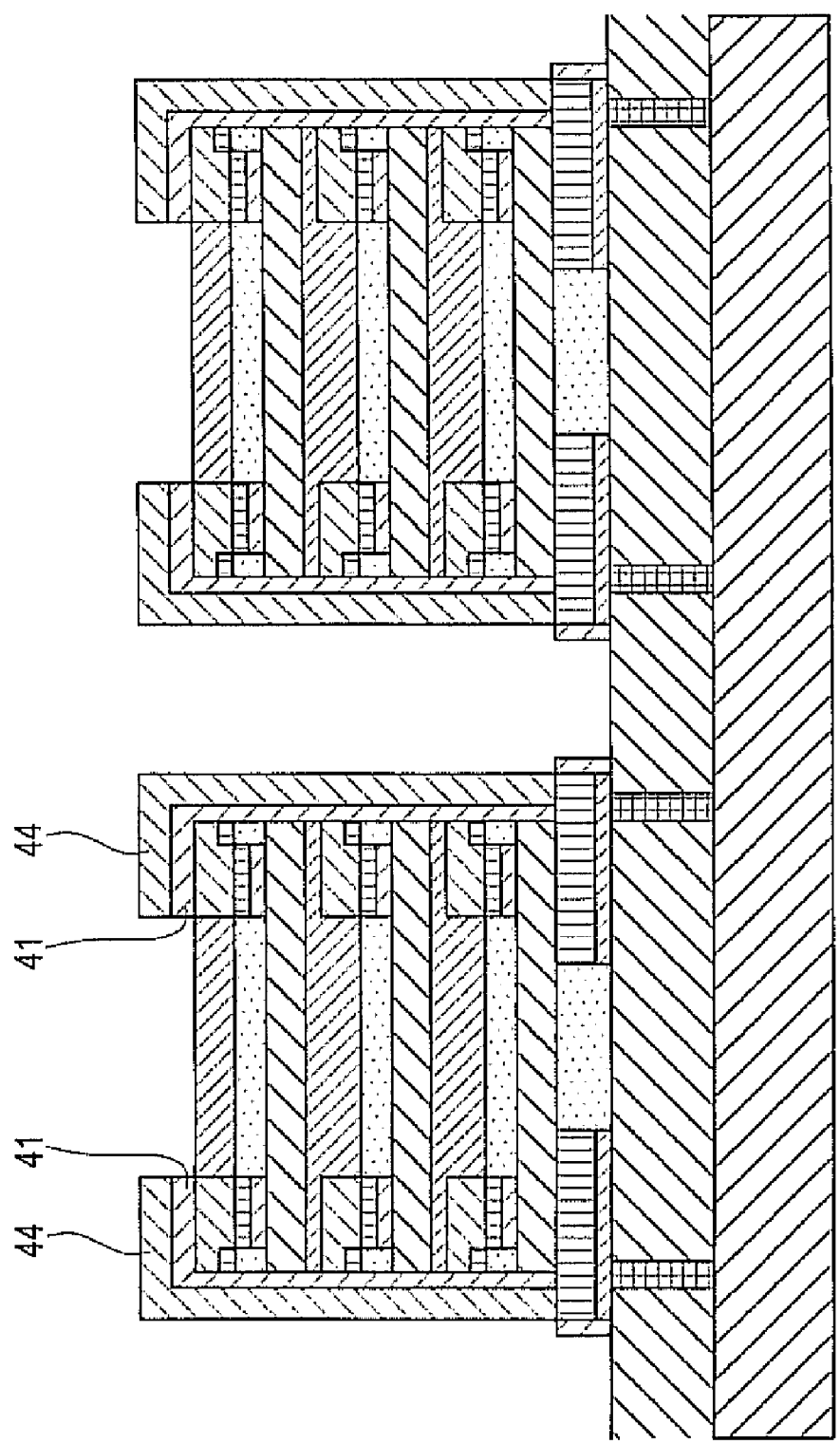
FIG. 21 is a cross-section diagram showing a process of forming side-wall wirings in accordance with various embodiments of the invention.

As shown in FIG. 21, etching can be carried out to remove the seed metal layer 41 at the portions where the side-wall wirings 44 are not formed. As a result, the process of forming the side-wall wirings 44 is completed.

Figure 22:
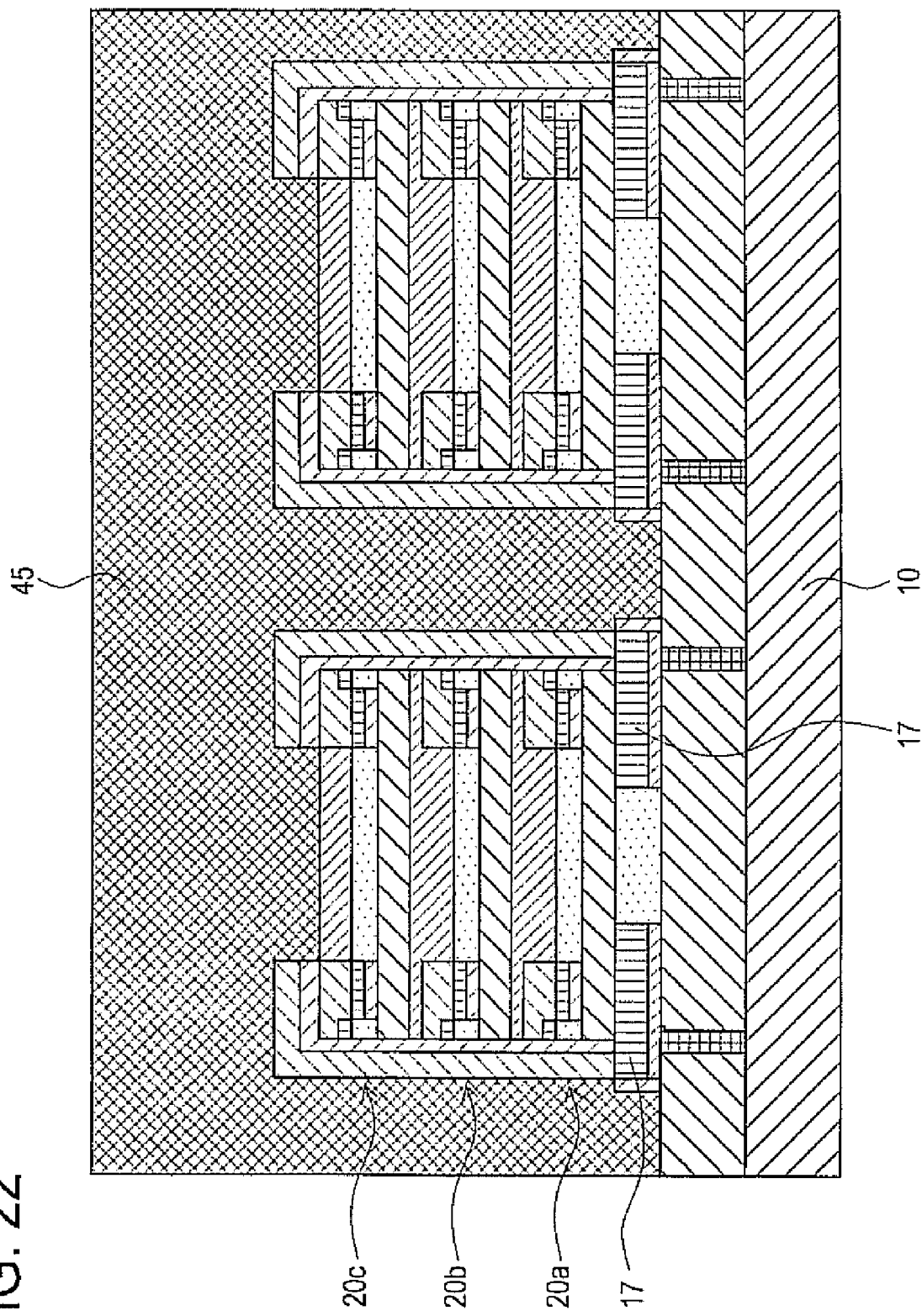
FIG. 22 is a cross-section diagram showing a process of forming a semiconductor package in accordance with various embodiments of the invention.

Next, the process of forming the stacked-type semiconductor package 1 will be described using the cross-section diagrams in FIG. 22 through FIG. 25. As shown in FIG. 22, the semiconductor chips 20a through 20c stacked on the rewiring portions 17 can be sealed by forming a resin layer 45. The resin layer 45 can include, but is not limited to, an insulating organic resin such as a polyimide resin or an epoxy resin, etc.

Figure 23:
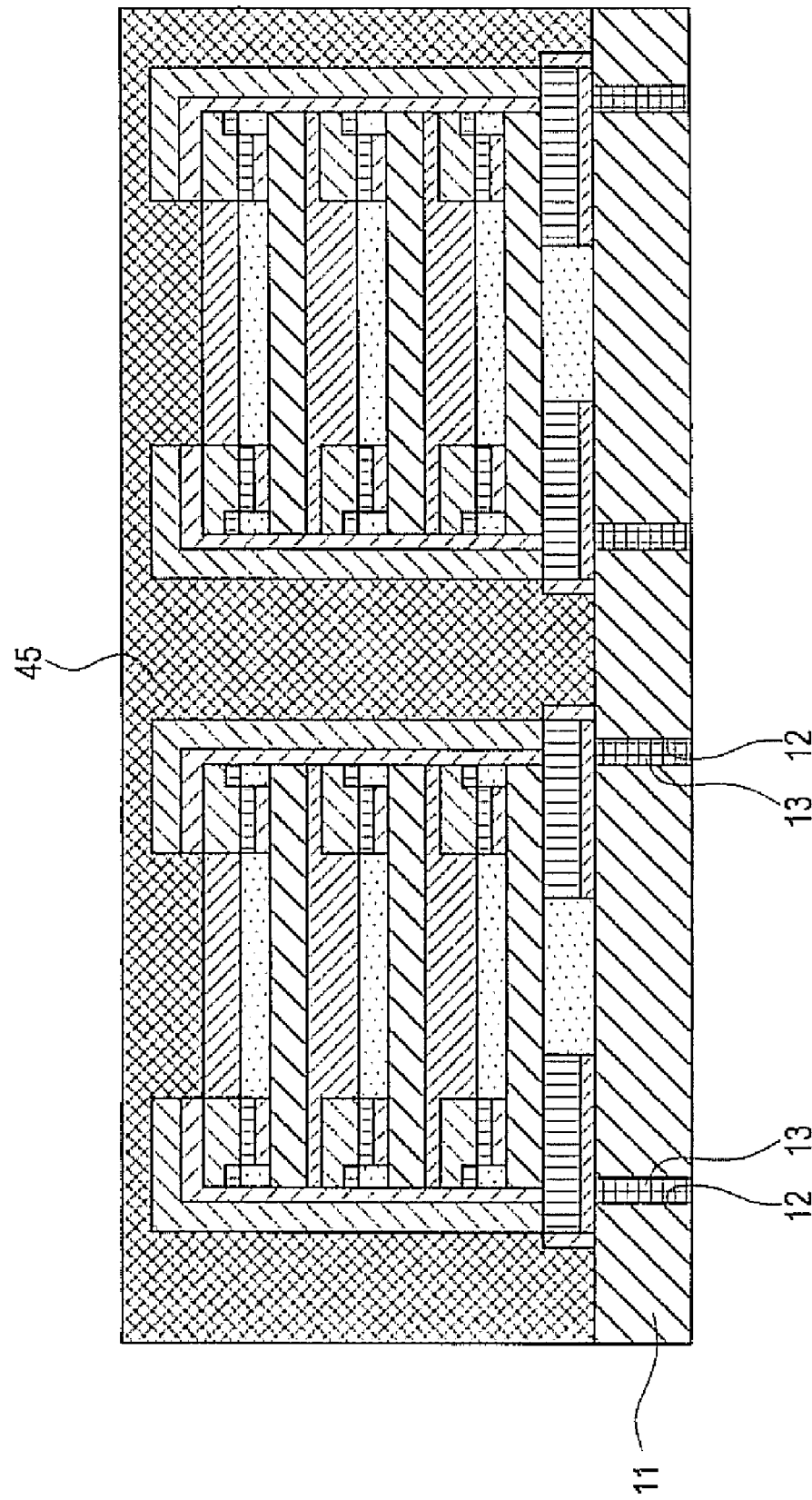
FIG. 23 is a cross-section diagram showing a process of forming the semiconductor package in accordance with various embodiments of the invention.

As shown in FIG. 23, wirings 13 of the insulating layer 11 can be exposed by removing the wafer 10 through, but is not limited to, grinding, and the like. Note that the thickness of the resin layer 45 can be reduced through grinding, but is not limited to such.

Figure 24:
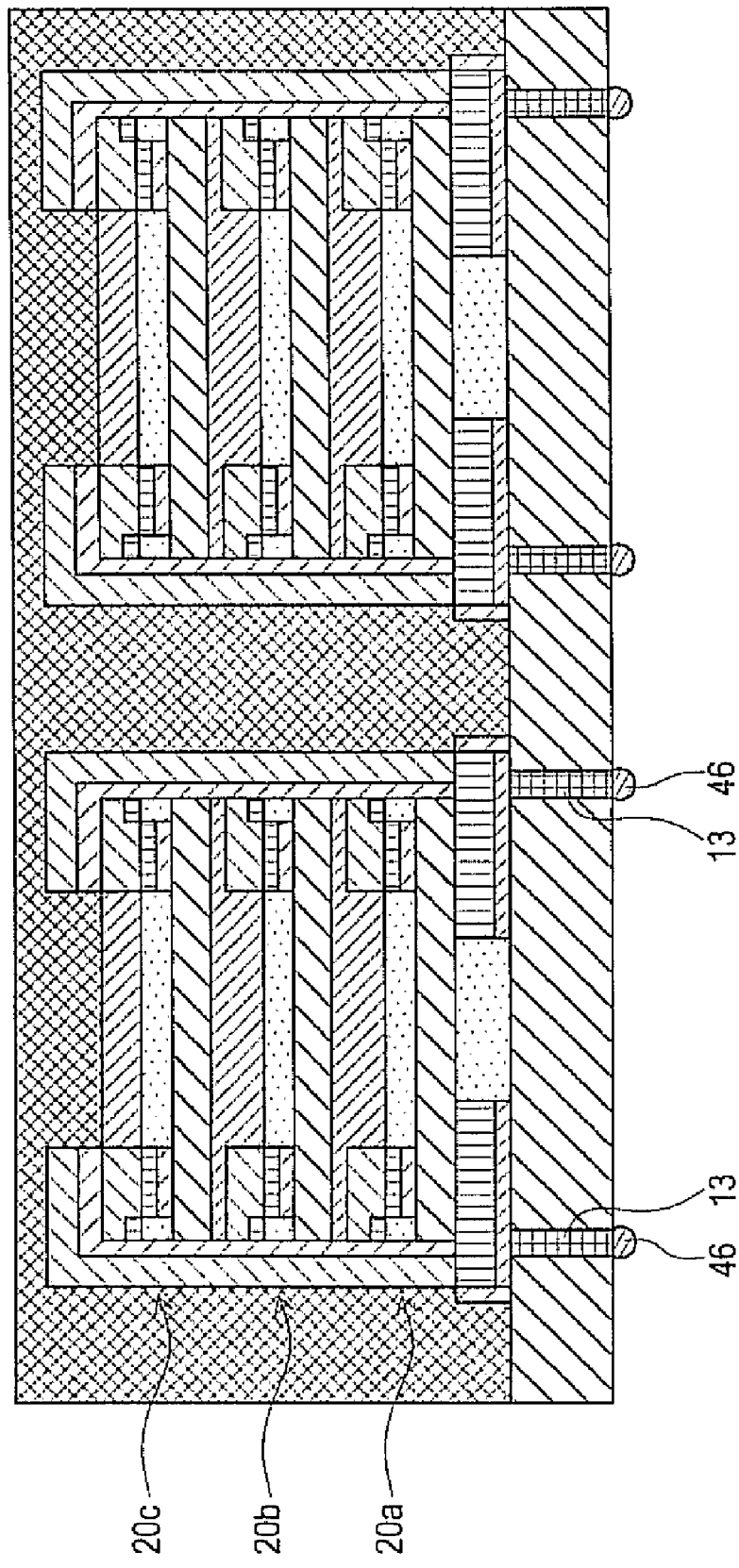
FIG. 24 is a cross-section diagram showing a process of forming the semiconductor package in accordance with various embodiments of the invention.

As shown in FIG. 24, solder balls 46 can be mounted on an exposed surface of the wirings 13. The semiconductor chips 20a through 20c can be electrically connected (or coupled) to outside terminals which are not shown, through the solder balls 46.

Figure 25:
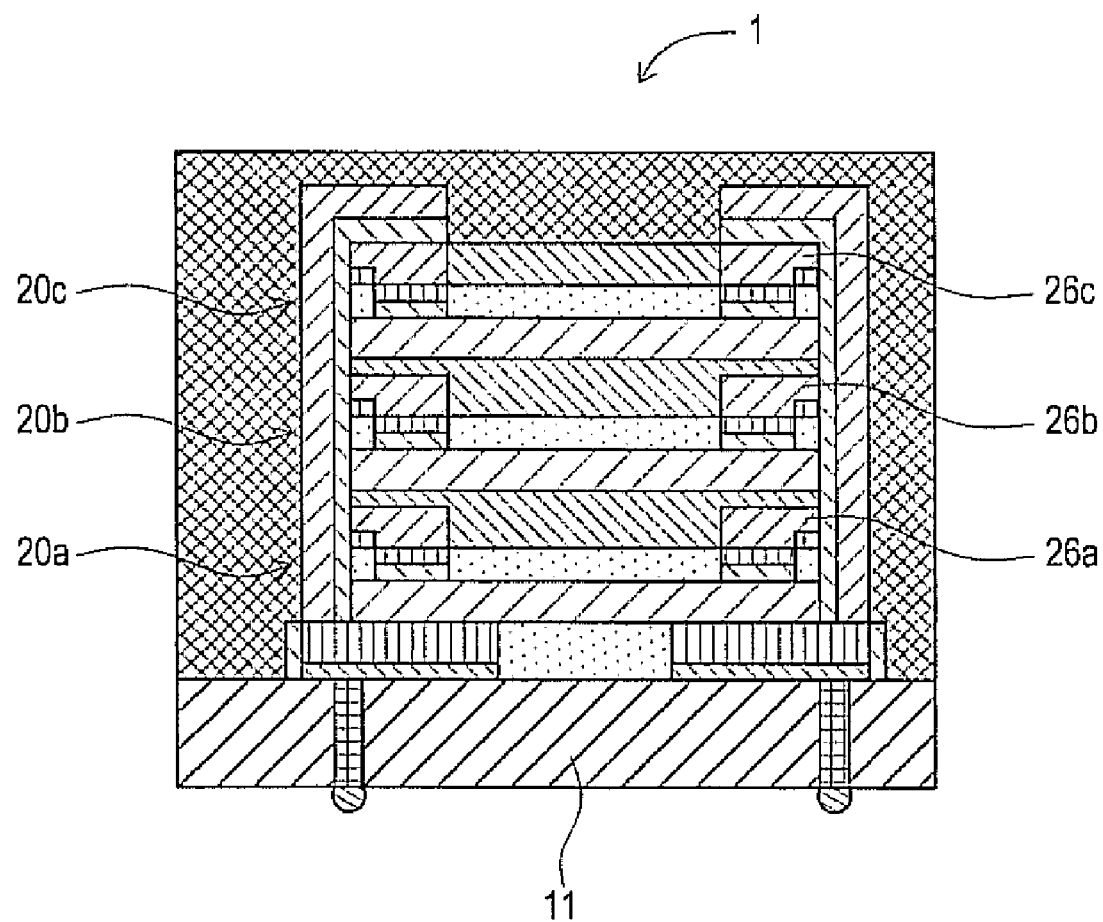
FIG. 25 is a cross-section diagram showing a semiconductor package in accordance with various embodiments of the invention.

As shown in FIG. 25, the stacked-type semiconductor package 1 is completed by dicing the wafer into individual packages.

As is clear from the above description, according to various embodiments of the invention, a plurality of semiconductor chips can be bonded at the same time on one surface of the insulating layer 11. Therefore, it is possible to simplify and reduce the time associated with the chip bonding process.

According to the present embodiment, the semiconductor chips are stacked so that the electrode side surfaces 29a through 29c of the side-wall electrodes 26a through 26c are lined up in a vertically upward direction of the rewiring portions 17. The side-wall wirings 44 that electrically connect (or couple) all the side-wall electrodes 26a through 26c of the stacked semiconductor chips with the rewiring portions 17 can be formed at the same time in one process, when a wafer process is used. As a result, it is possible to further simplify and reduce the time associated with the chip bonding process.

In one embodiment, the semiconductor chips 20a through 20c are stacked and bonded in the state that a plurality of fan-out wirings are formed on the wafer 10 in a matrix. Since the wafer process can be used, a dedicated jig or dedicated device becomes unnecessary, thereby reducing costs. Since calibration, etc. of the coordinate position may be carried out in units of wafer 10, process efficiency can be improved.

A manufacturing method of a stacked-type semiconductor package 2 (FIG. 35) according to an embodiment of the invention will be described using FIG. 26 through FIG. 35. In this embodiment, semiconductor chips having through electrodes are stacked and bonded. Here, the case that semiconductor chips 50a through 50c are stacked is given as an example. The method of forming the fan-out wirings 9 on the insulating layer 11 can be similar to that described herein, and therefore, a detailed description thereof is hereby omitted.

Figure 26:
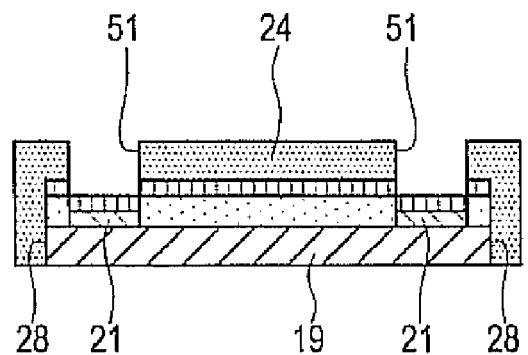
FIG. 26 is a cross-section diagram showing a process of manufacturing through electrodes in accordance with various embodiments of the invention.

The process of manufacturing the through electrodes of the semiconductor chips 50 will be described using the cross-section diagrams in FIG. 26 through FIG. 30. The processes shown in FIG. 8 through FIG. 10 (and described herein) can be utilized with the processes of manufacturing the semiconductor chips 50 according to the present embodiment, and therefore further detailed description thereof is hereby omitted. As shown in FIG. 26, the photoresist layer 24 can be removed at regions 51 where the through electrodes are to be formed, through photolithography, but is not limited to such. Regions 51 can be formed so as to house pads 21 in a vertically downward direction (e.g., downward direction on the sheet). The regions 51 can be formed in such a way that the side surfaces, from the side surfaces of the regions 51, which are at the peripheral side of the bare chip 19 exist further inside the bare chip 19 than the chip side surfaces 28 of the bare chip 19.

Figure 27:
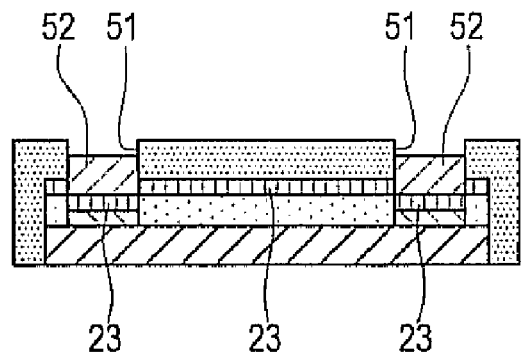
FIG. 27 is a cross-section diagram showing a process of manufacturing through electrodes in accordance with various embodiments of the invention.

As shown in FIG. 27, Cu plating can be carried out on the seed metal layer 23 of the regions 51 through electrolytic plating, but is not limited to such. As a result, through electrodes 52 can be formed.

Figure 28:
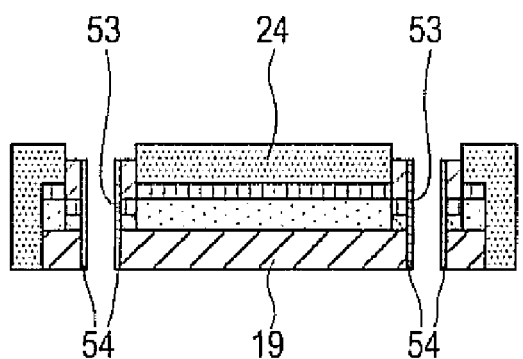
FIG. 28 is a cross-section diagram showing a process of manufacturing through electrodes in accordance with various embodiments of the invention.

As shown in FIG. 28, through holes 53 that house the through electrodes 52 and penetrate the bare chip 19 can be formed in the stacking direction (e.g., vertical direction of the drawing) of the semiconductor chips. The through holes 53 are formed by laser irradiation or dry etching, but is not limited to such. Then, a protective film 54 can be formed on the inner wall of the through holes 53. The protective film 54 can be formed, for instance, by oxidizing the silicon in the inner wall of the through holes 53, but is not limited to such. The protective film 54 may be formed by using, but is not limited to, the CVD method.

Figure 29:
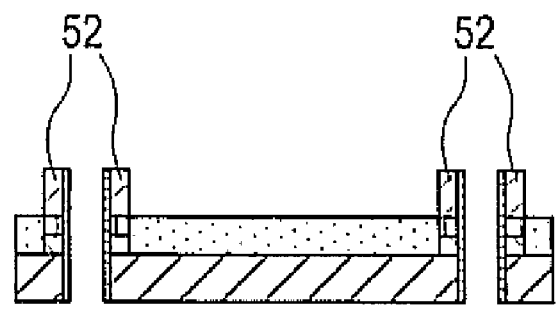
FIG. 29 is a cross-section diagram showing a process of manufacturing through electrodes in accordance with various embodiments of the invention.

As shown in FIG. 29, the photoresist layer 24 can be peeled off to carry out etching. The seed metal layer 23 can be removed at the portions where the through electrodes 52 are not formed, through etching, but is not limited to such.

Figure 30:
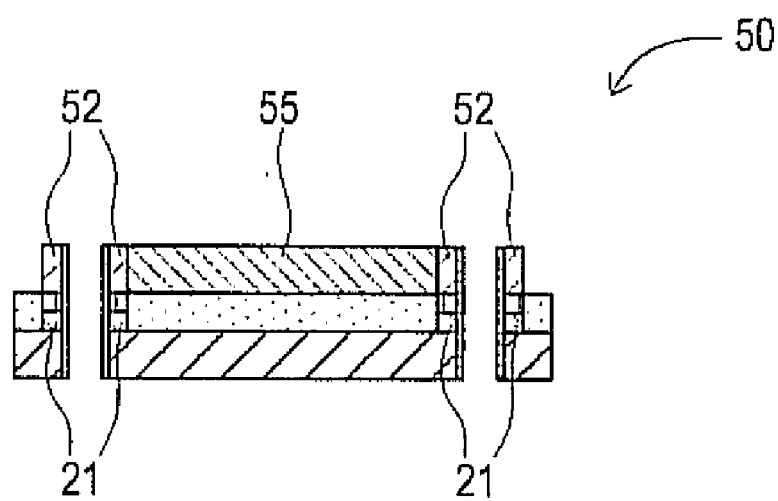
FIG. 30 is a cross-section diagram showing a process of manufacturing through electrodes in accordance with various embodiments of the invention.

As shown in FIG. 30, the spaces between the through electrodes 52 are filled with DAF material 55 and are bonded by the polyimide adhesive. Here, this process can be omitted. As a result, a semiconductor chip 50 is formed which has through electrodes 52 formed with through holes 53 therein. Then, pads 21 can be lead out to the upper surface and lower surface of the semiconductor chip 50, by through electrodes 52.

Next, using the cross-section diagrams in FIG. 31 through FIG. 34, a description will be given on a process of stacking the semiconductor chips 50a through 50c on the rewiring portions 17 to form through wirings 64 that commonly connect or couple all the through electrodes 52a through 52c with the rewiring portions 17.

Figure 31:
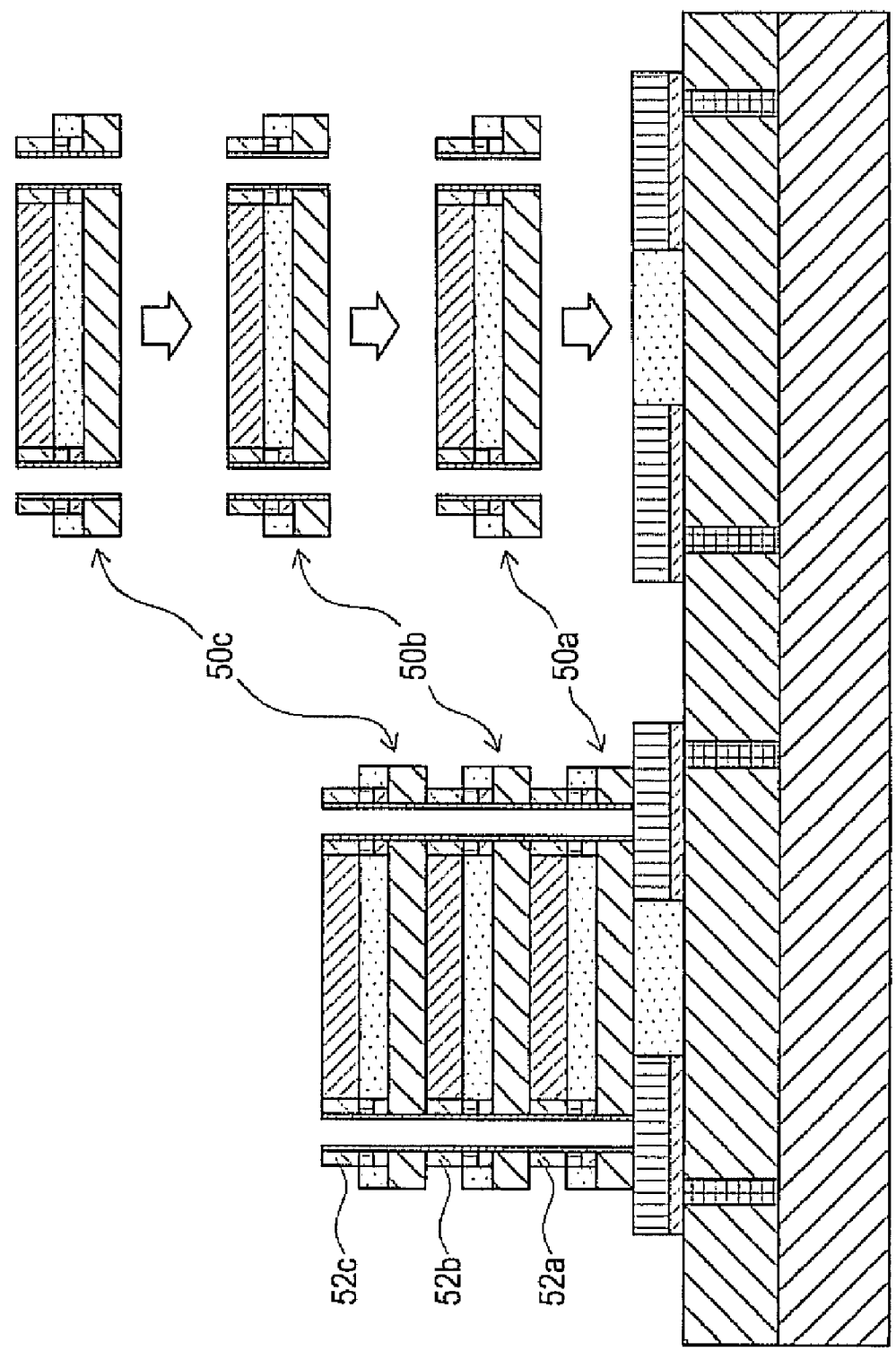
FIG. 31 is a cross-section diagram showing a process of forming through wirings in accordance with various embodiments of the invention.

As shown in FIG. 31, semiconductor chips 50a through 50c can be stacked on the rewiring portions 17 by using a die bonder, but is not limited to such. At this time, the semiconductor chips 50a through 50c can be stacked so that the through holes of the through electrodes 52a through 52c are arranged in a straight line in a vertically upward direction (e.g., upward direction on the sheet) of the rewiring portion 17 and form one via hole.

Figure 32:
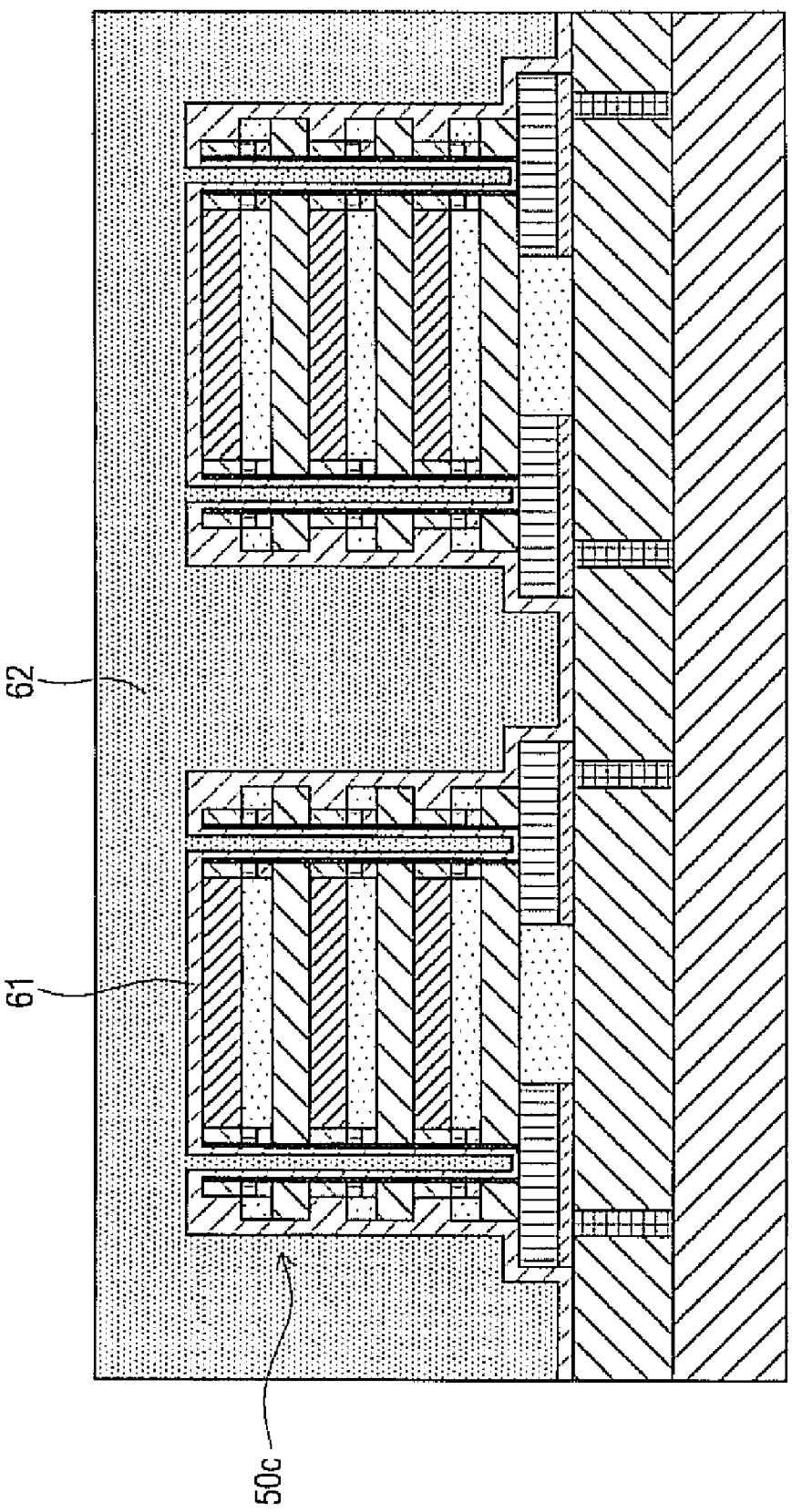
FIG. 32 is a cross-section diagram showing a process of forming through wirings in accordance with various embodiments of the invention.

As shown in FIG. 32, a seed metal layer 61 is formed on the surface of the wafer 10 on which semiconductor chips 50a through 50c are stacked. Then, a photoresist layer 62 which is thicker than the distance from the surface of the insulating layer 11 to the uppermost surface of the semiconductor chip 50c can be formed in the insulating layer 11.

Figure 33:
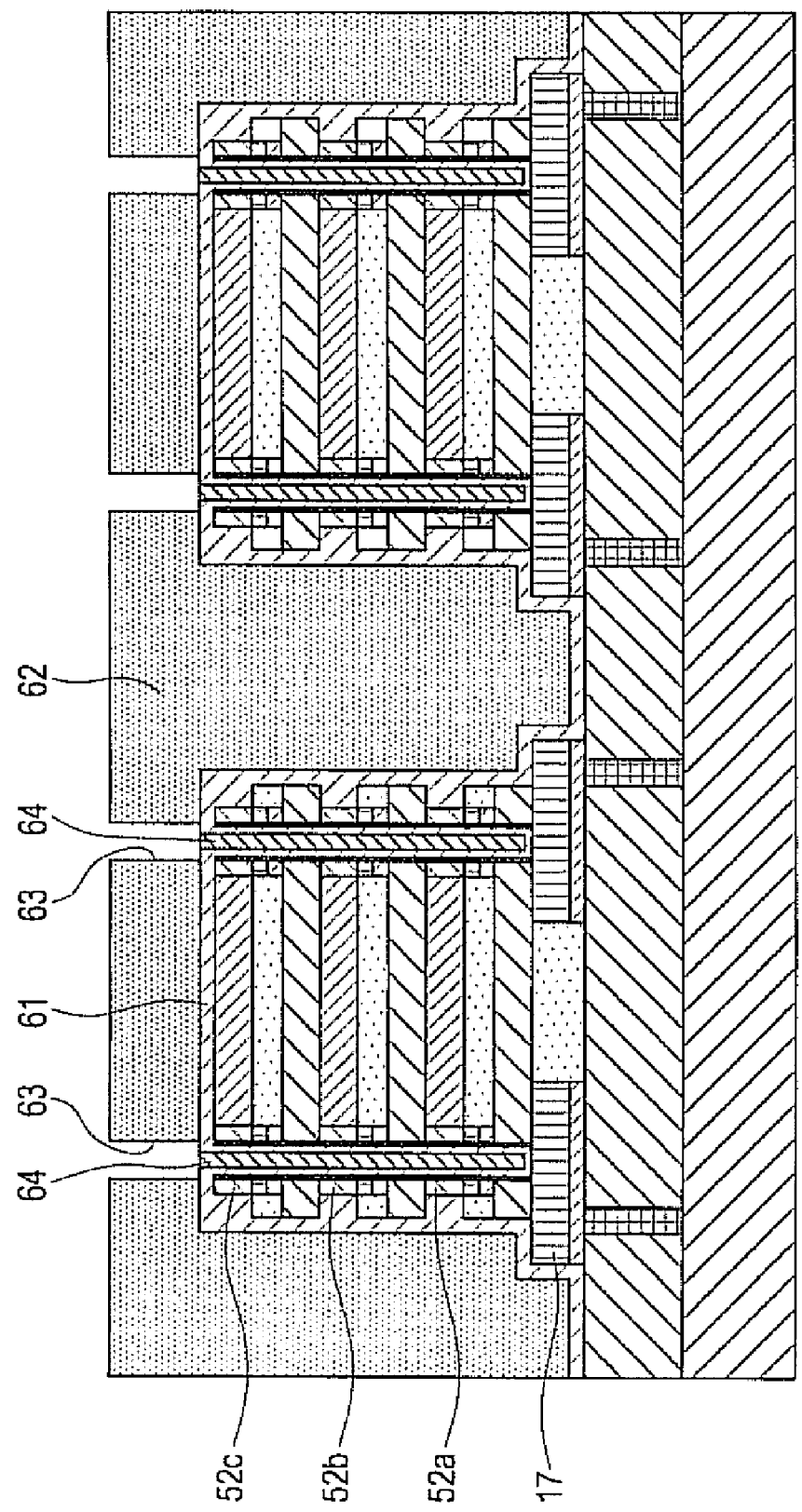
FIG. 33 is a cross-section diagram showing a process of forming through wirings in accordance with various embodiments of the invention.

As shown in FIG. 33, opening portions 63 for forming the through wirings can be formed through photolithography, but is not limited to such. Opening portions 63 can be formed so as to pass the through holes of the through electrodes 52a through 52c and extend up to the rewiring portions 17. Then, through wirings 64 that electrically connect or couple the through electrodes 52a through 52c and the rewiring portions 17 can be formed inside the through holes. The through wirings 64 can be formed using a method of filing the through holes with Cu by flowing a current in the seed metal layer 61 to perform Cu plating, but is not limited to such. The through wirings 64 may be formed by using a method in which Cu is embedded in the through holes through electroless plating and the embedded Cu and the electrodes, etc. are bonded by flowing a current in the seed metal layer 61 to thus perform Cu plating, but is not limited to such.

Figure 34:
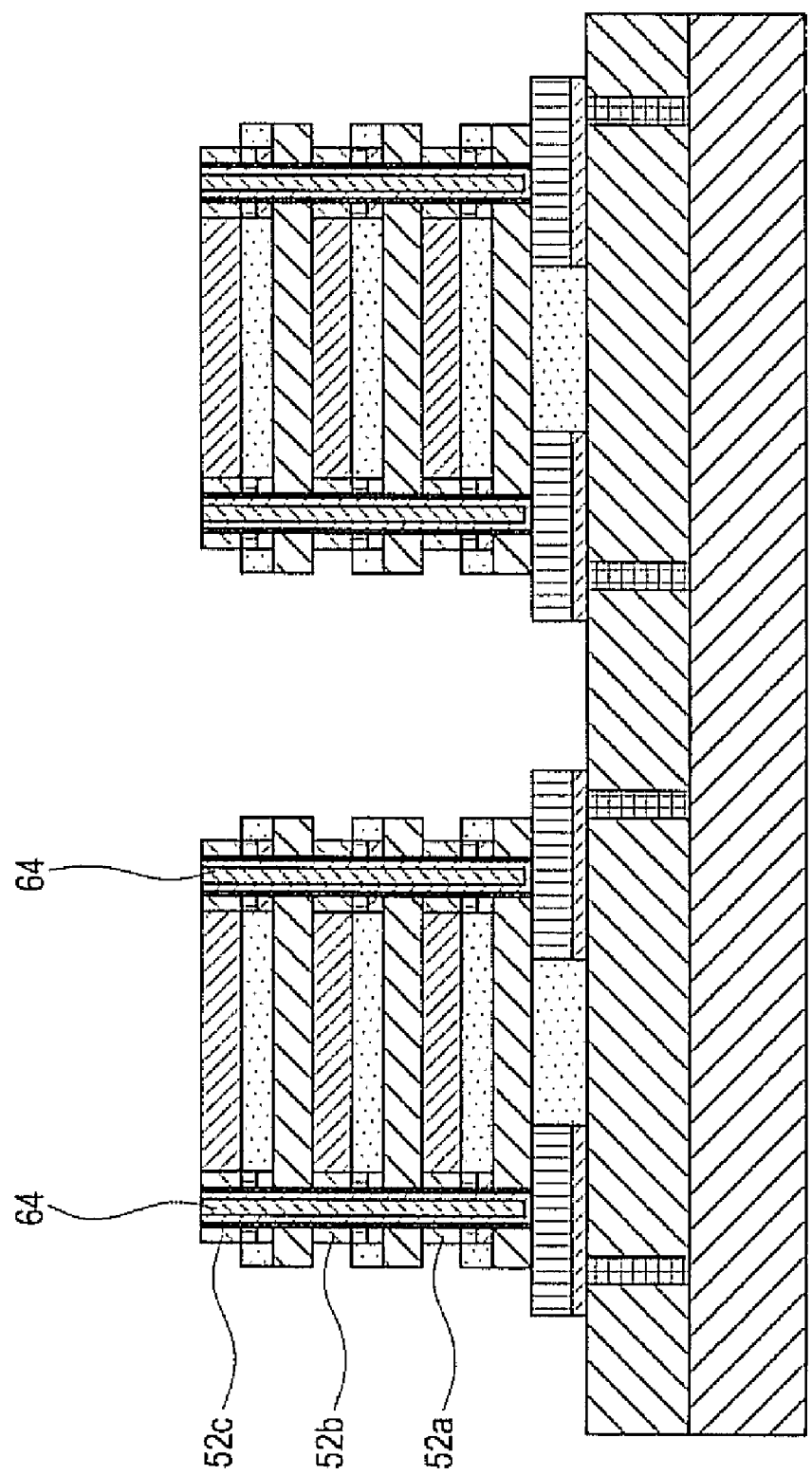
FIG. 34 is a cross-section diagram showing a process of forming through wirings in accordance with various embodiments of the invention.

As shown in FIG. 34, the photoresist layer 62 can be peeled off and the seed metal layer 61 can be removed at portions where the through electrodes 52a through 52c are not formed by subsequent etching, but is not limited to such. As a result, the process of forming the through wirings 64 can be completed.

Figure 35:
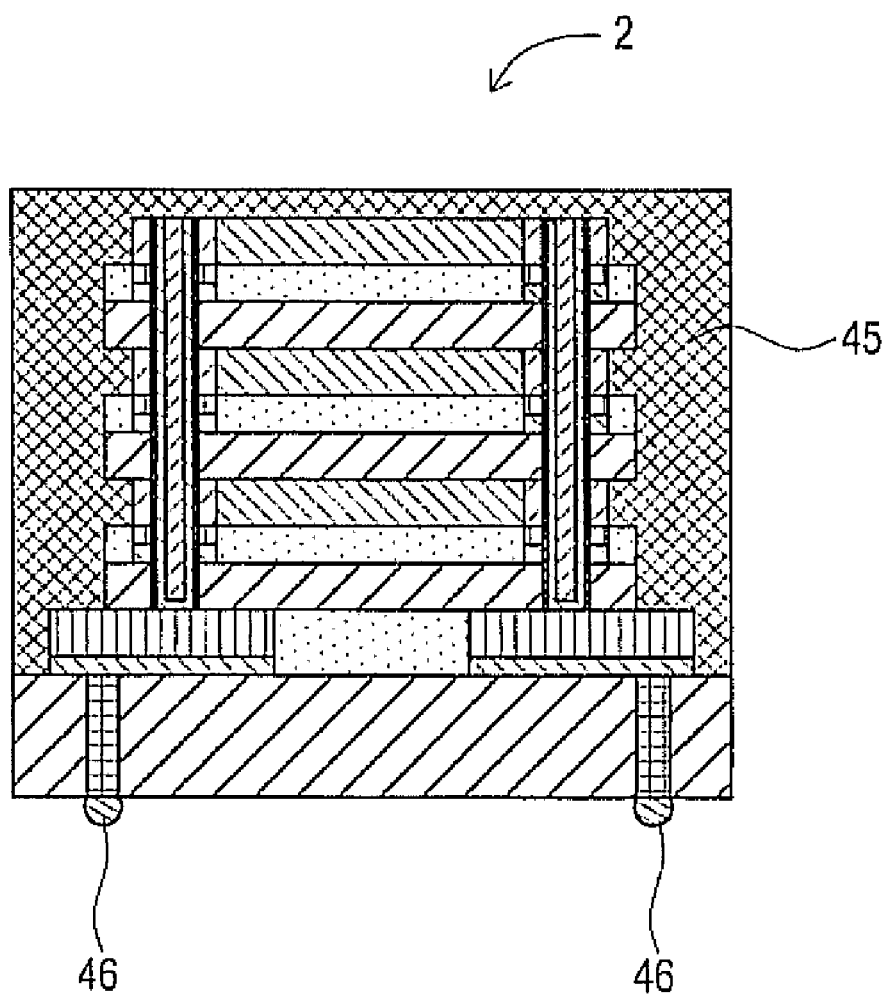
FIG. 35 is a cross-section diagram showing a semiconductor package in accordance with various embodiments of the invention.

Then, processes such as sealing by using the resin layer 45, removing the wafer 10, mounting the solder balls 46, dicing into individual packages and the like are carried out. These processes can be implemented in a manner similar to those of FIG. 22 through FIG. 25, and therefore, further detailed description thereof is hereby omitted. Then, the stacked-type semiconductor package 2 shown in FIG. 35 is completed.

As is clear from the above description, according to the present embodiment, the semiconductor chips are stacked so that the through holes in the through electrodes 52a through 52c are arranged in a straight line in a vertically upward direction of the rewiring portions 17.

The through wirings 64 which electrically connect or couple all the through electrodes 52a through 52c of the stacked semiconductor chips with the fan-out electrodes can be formed at the same time in one process, by using a wafer process. As a result, it is possible to further simplify and reduce the time associated with the chip bonding process.

A manufacturing method of a stacked-type semiconductor package 3 (FIG. 42) according to an embodiment of the invention will be described using FIG. 36 through FIG. 42. In this embodiment, the solder balls can be mounted upward in the stacking direction of the semiconductor chips.

Figure 36:
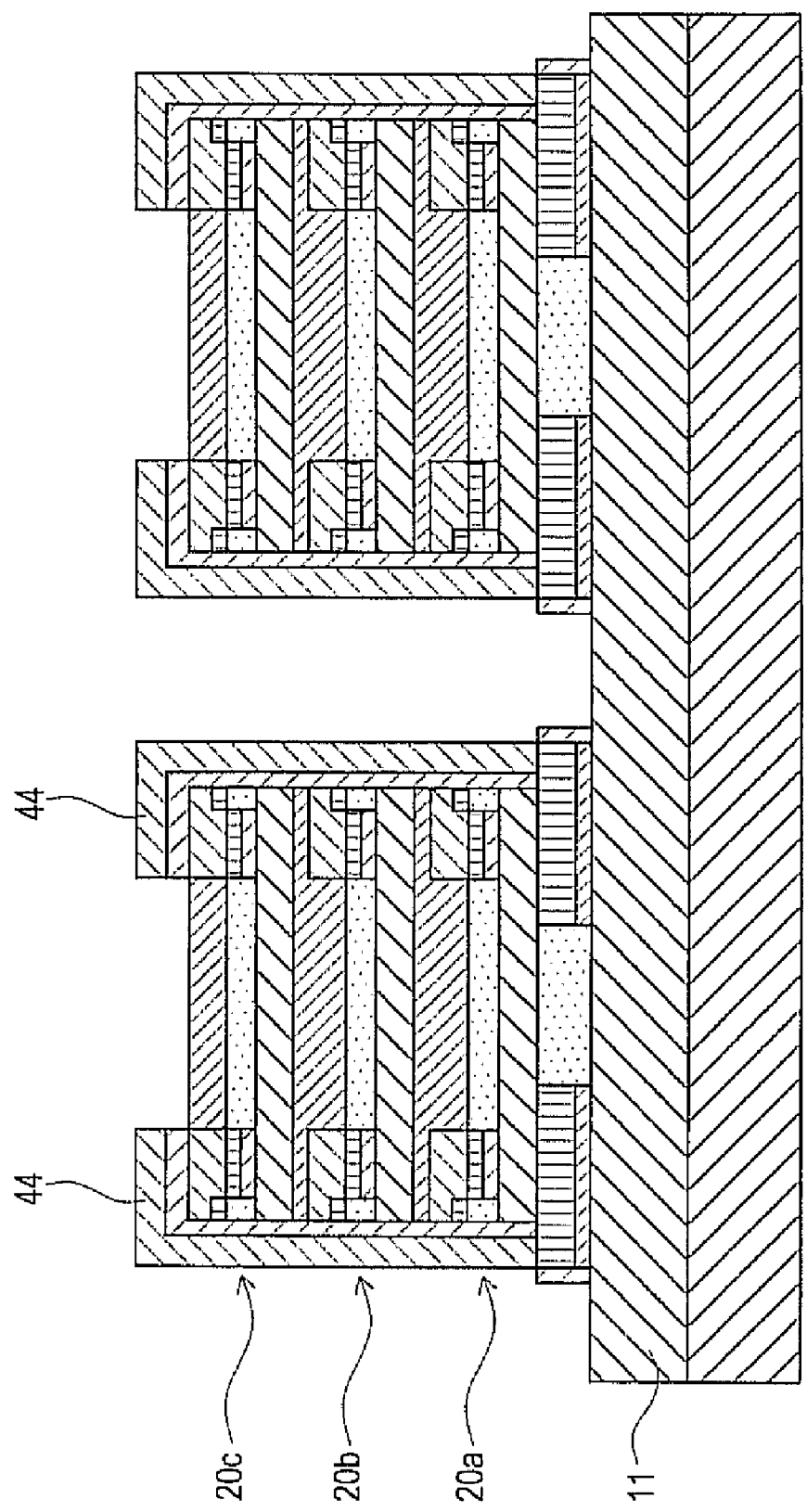
FIG. 36 is a cross-section diagram showing a process of forming posts in accordance with various embodiments of the invention.

FIG. 36 is a view showing a state that the semiconductor chips 20a through 20c are stacked on the insulating layer 11 to form the side-wall wirings 44, by carrying out the processes from FIG. 8 through FIG. 21 as described herein. However, wirings 13 are not formed in the insulating layer 11.

Figure 37:
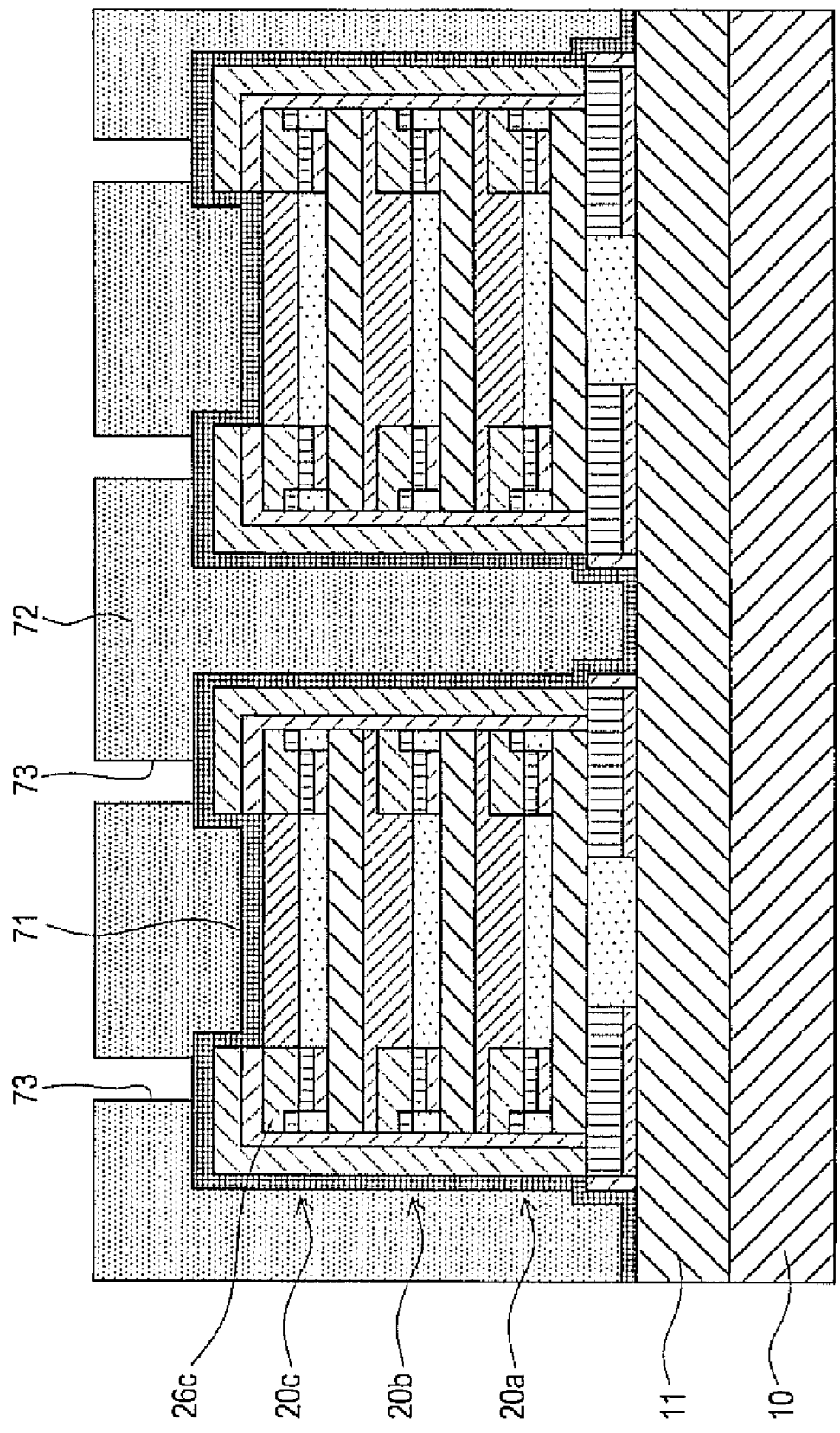
FIG. 37 is a cross-section diagram showing a process of forming posts in accordance with various embodiments of the invention.

Next, the process of forming posts on the side-wall wirings 44 of the semiconductor chip 20c in the uppermost layer will be described using the cross-section diagrams in FIG. 37 through FIG. 39. As shown in FIG. 37, a seed metal layer 71 can be formed on the surface of the wafer 10 on which the semiconductor chips 20a through 20c are stacked. Then, a photoresist layer 72 which is thicker than the distance from the surface of the insulating layer 11 to the uppermost surface of the semiconductor chip 20c can be formed on the insulating layer 11. Then, opening portions 73 for forming the posts are formed by photolithography, but is not limited to such. Opening portions 73 can be formed so as to extend up to the upper surface of the seed metal layer 71.

Figure 38:
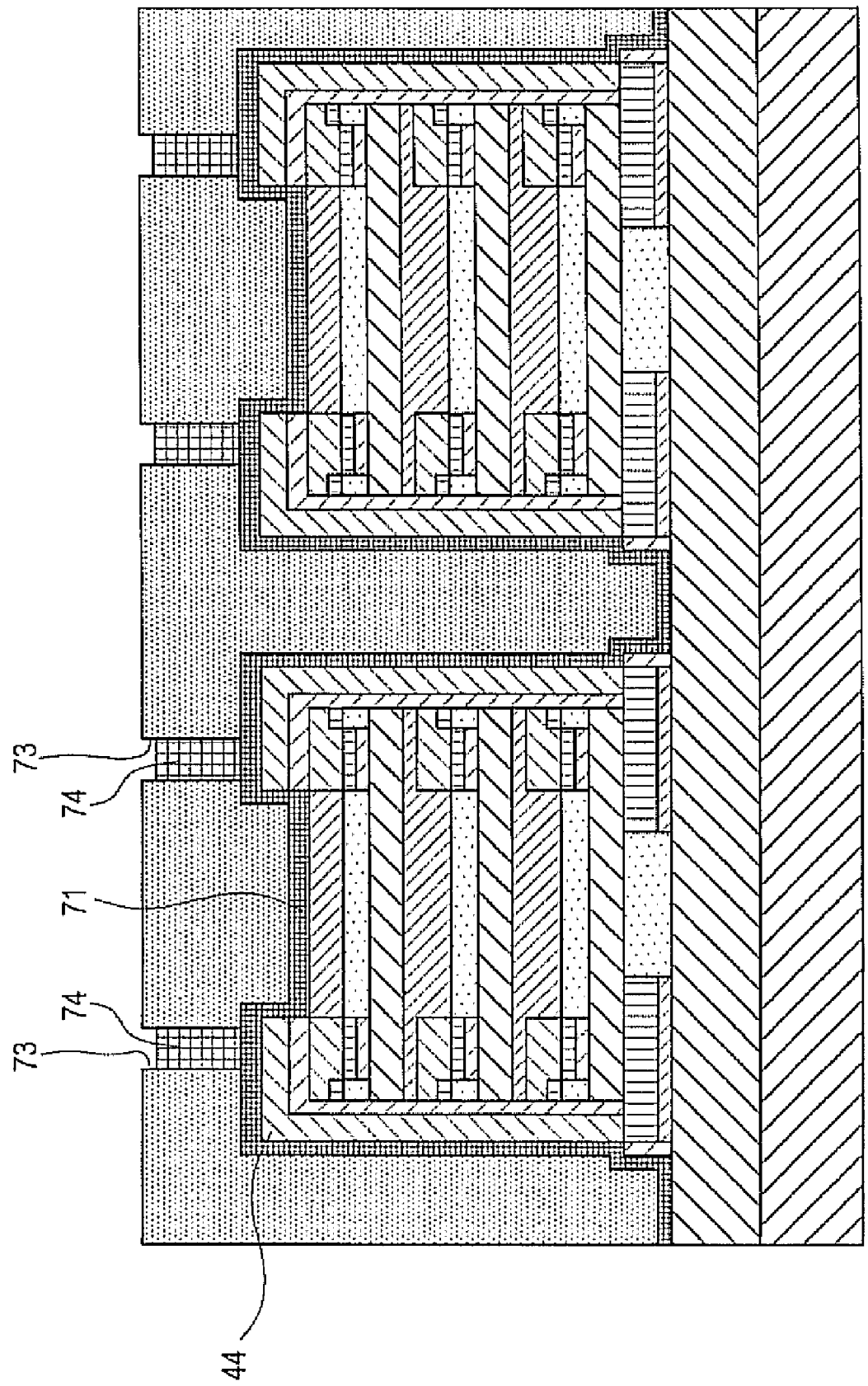
FIG. 38 is a cross-section diagram showing a process of forming posts in accordance with various embodiments of the invention.

As shown in FIG. 38, pillar-like posts 74 made of Cu can be embedded inside opening portions 73, and a current can be flown in the seed metal layer 71 to perform Cu plating, but is not limited to such. As a result, the embedded posts 74 and the side-wall wirings 44 can be electrically bonded. The posts 74 may be formed by using a method in which Cu plating is performed by flowing a current in the seed metal layer 71 to fill the opening portions 73 with Cu, but is not limited to such.

Figure 39:
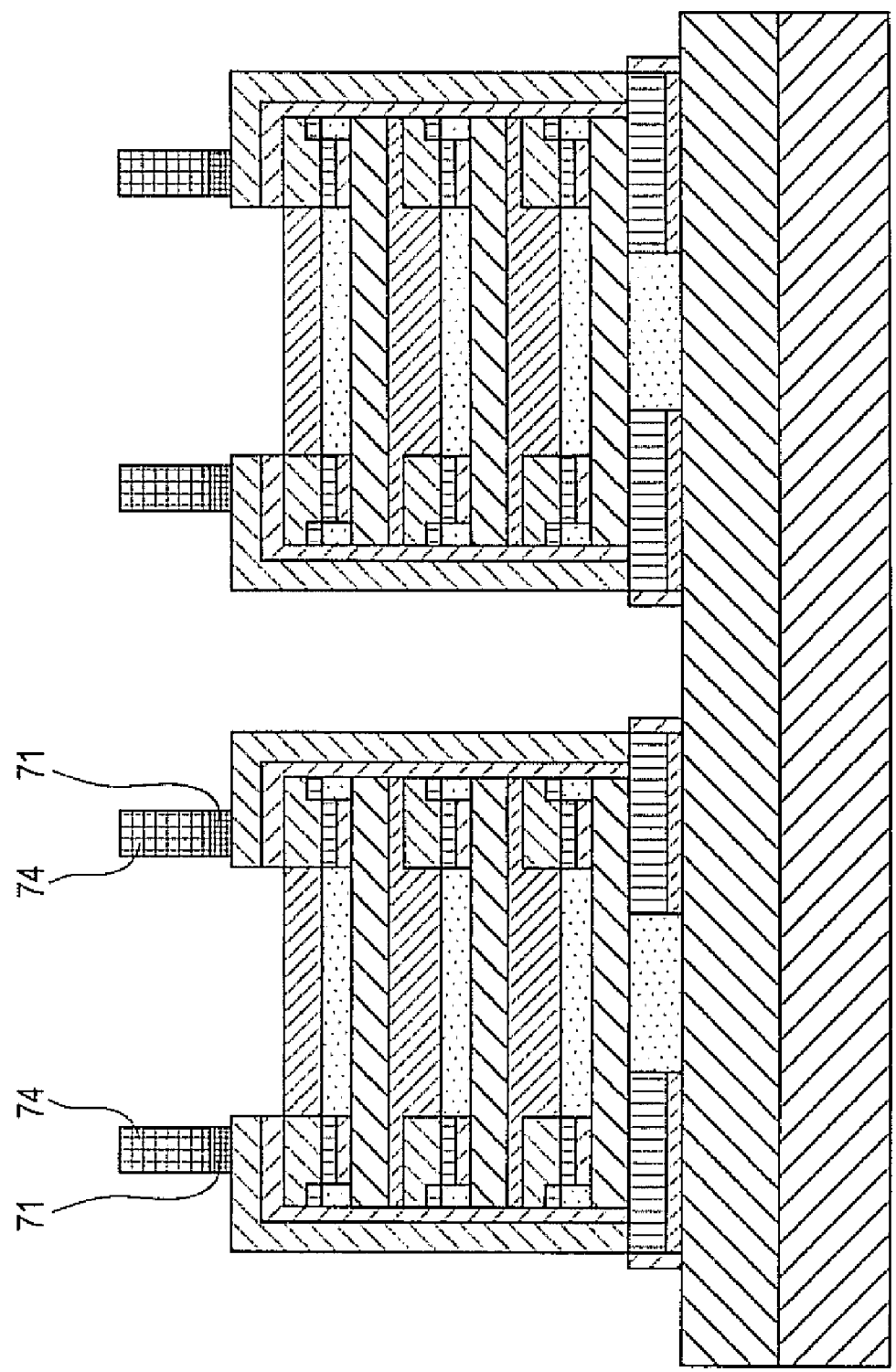
FIG. 39 is a cross-section diagram showing a process of forming posts in accordance with various embodiments of the invention.

As shown in FIG. 39, the photoresist layer 72 can be peeled off, and the seed metal layer 71 can be removed at the portions where the posts 74 are not formed by subsequent etching. As a result, the process of forming posts 74 is completed.

Figure 40:
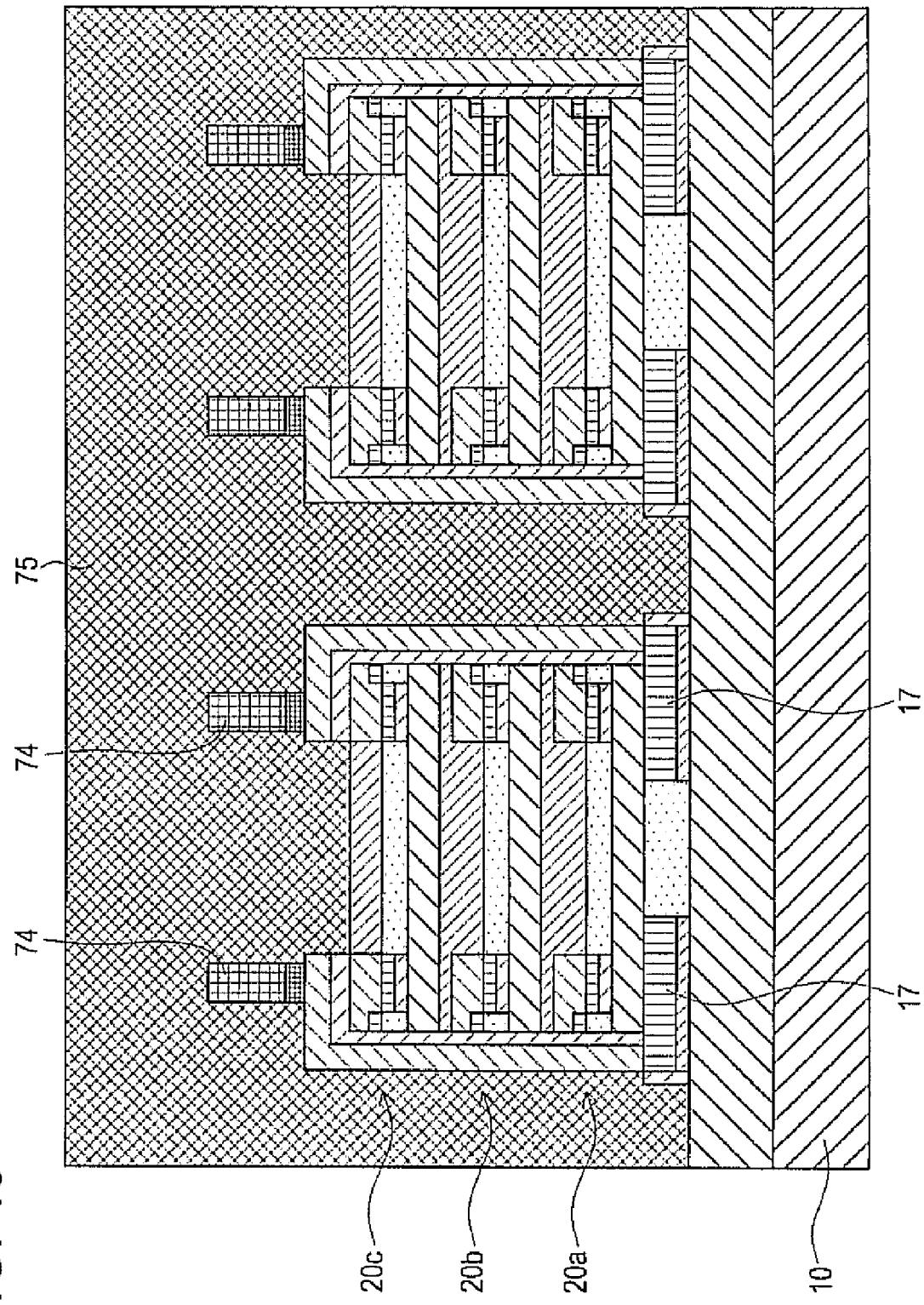
FIG. 40 is a cross-section diagram showing a process of forming semiconductor packages in accordance with various embodiments of the invention.

Next, the process of forming the stacked-type semiconductor package 3 will be described using the cross-section diagrams in FIG. 40 through FIG. 42. As shown in FIG. 40, semiconductor chips 20a through 20c stacked on the rewiring portions 17 and posts 74 can be sealed by forming a resin layer 75.

Figure 41:
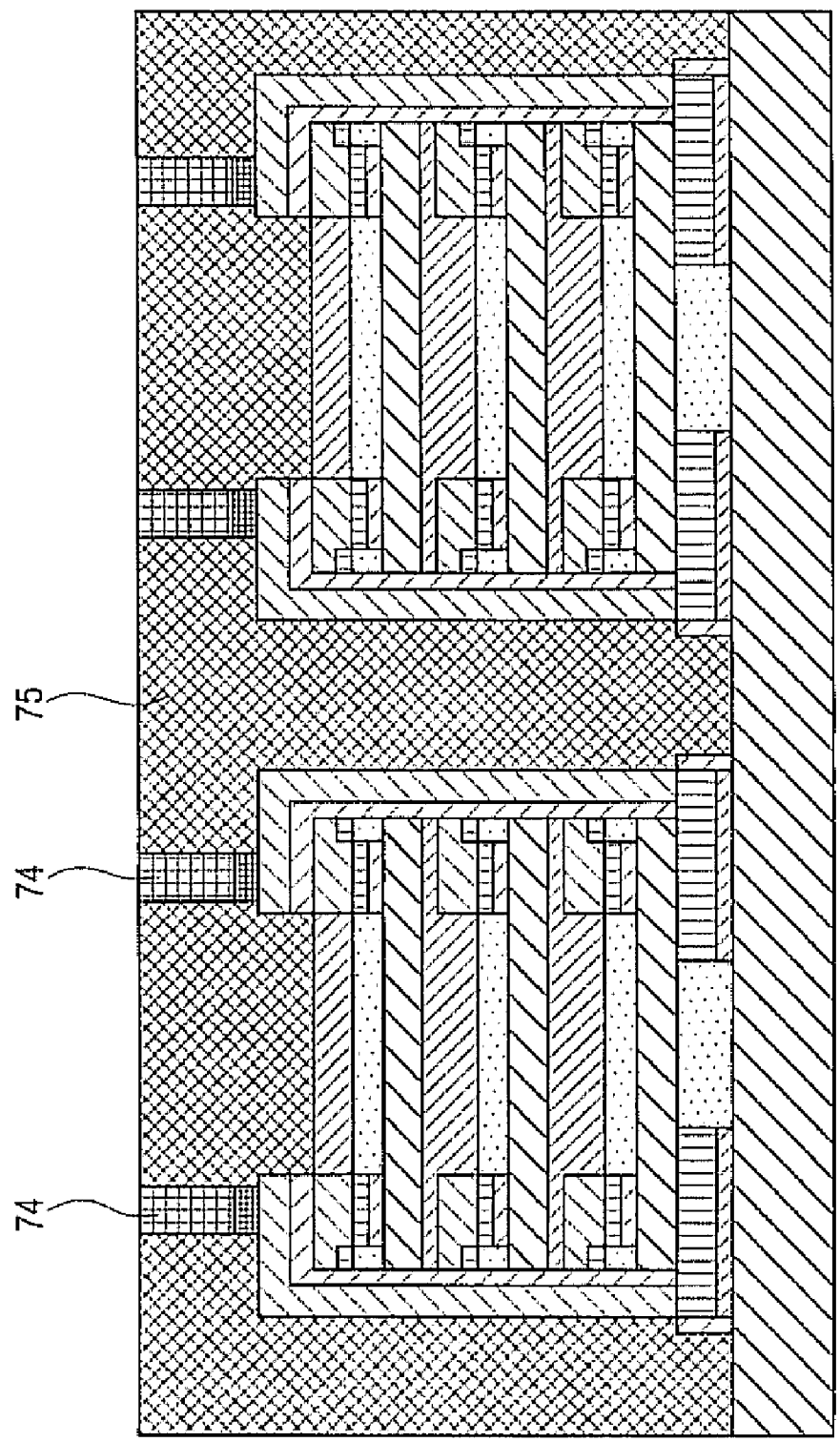
FIG. 41 is a cross-section diagram showing a process of forming semiconductor packages in accordance with various embodiments of the invention.

As shown in FIG. 41, the resin layer 75 can be thinned through, but is not limited to, grinding until the posts 74 are exposed. The wafer 10 can be removed by grinding or the like.

Figure 42:
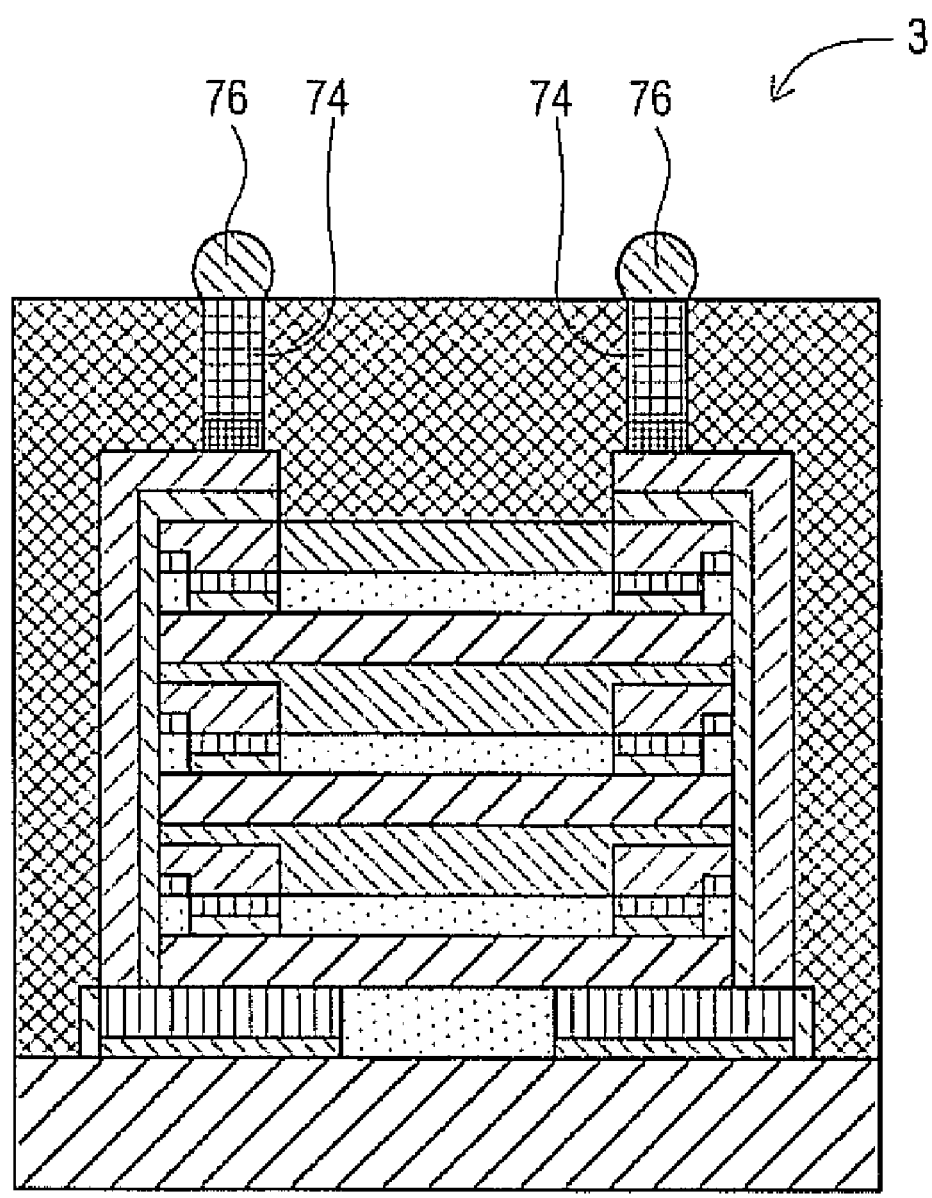
FIG. 42 is a cross-section diagram showing a semiconductor package in accordance with various embodiments of the invention.
Figure 43:
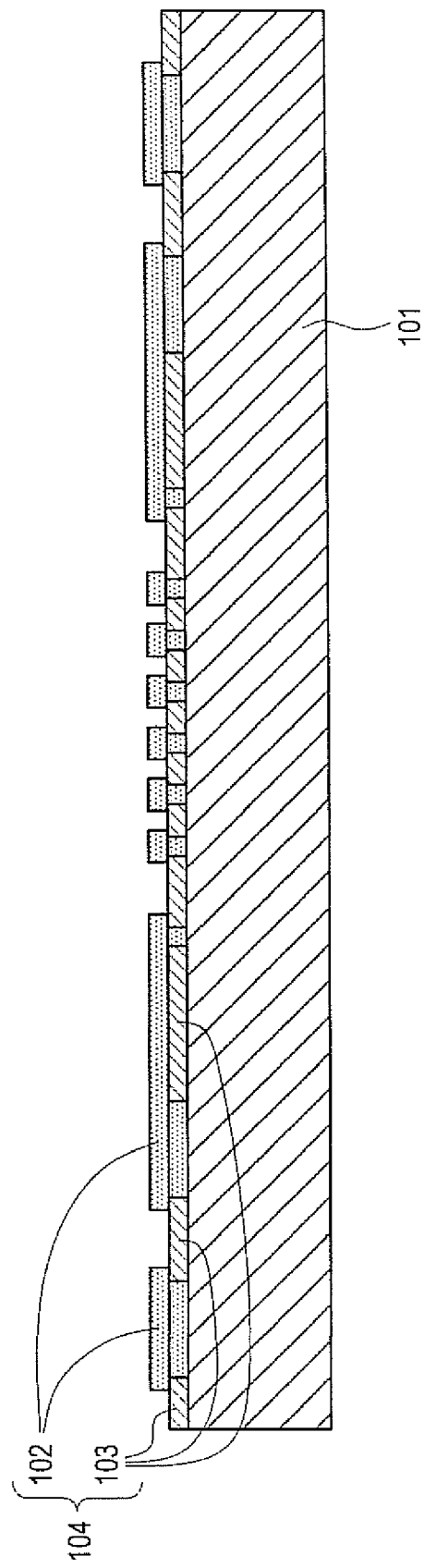
FIG. 43 is a cross-section diagram showing a manufacturing process in the related art.
Figure 44:
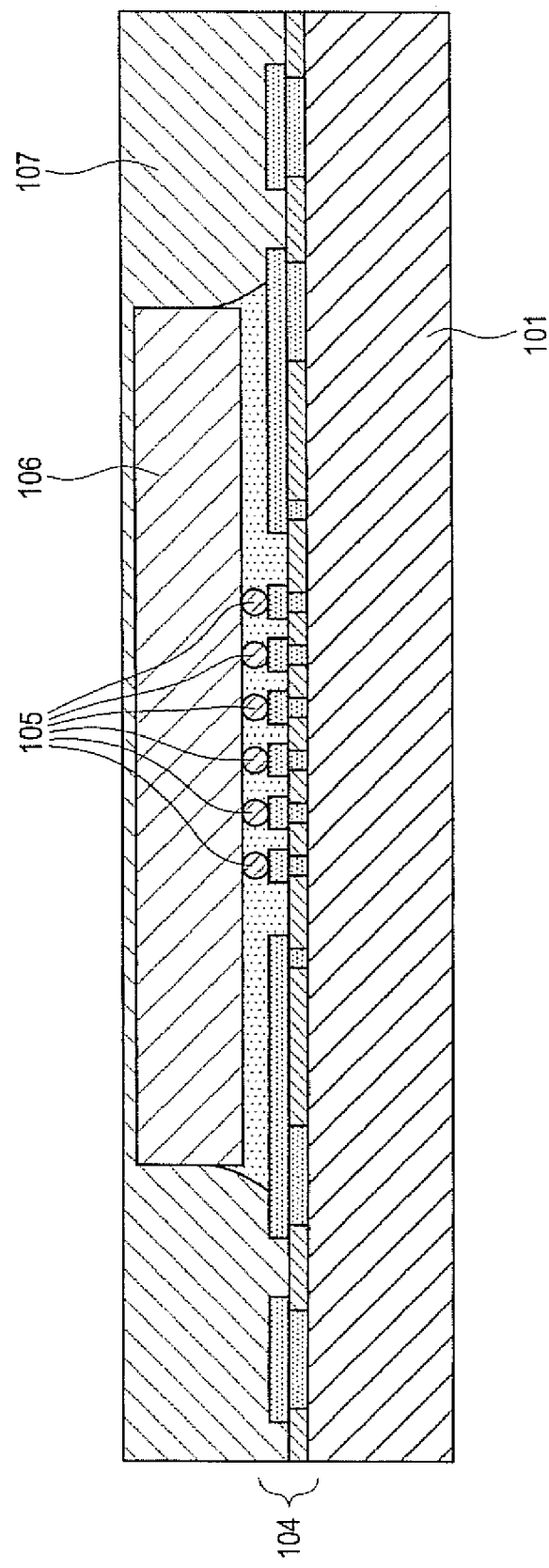
FIG. 44 is a cross-section diagram showing a manufacturing process in the related art.
Figure 45:
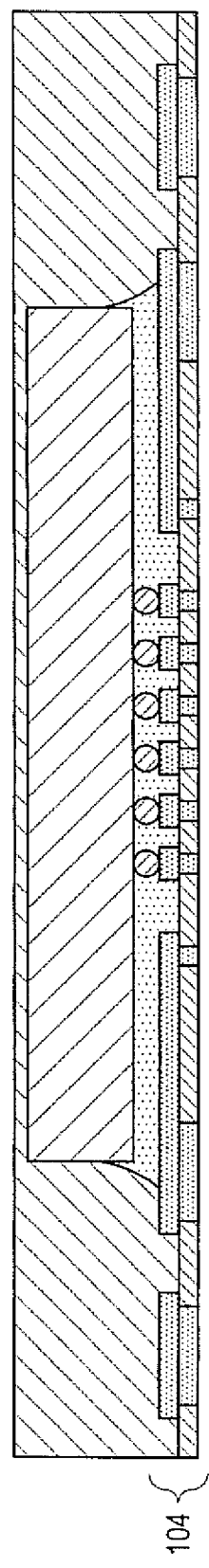
FIG. 45 is a cross-section diagram showing a manufacturing process in the related art.
Figure 46:
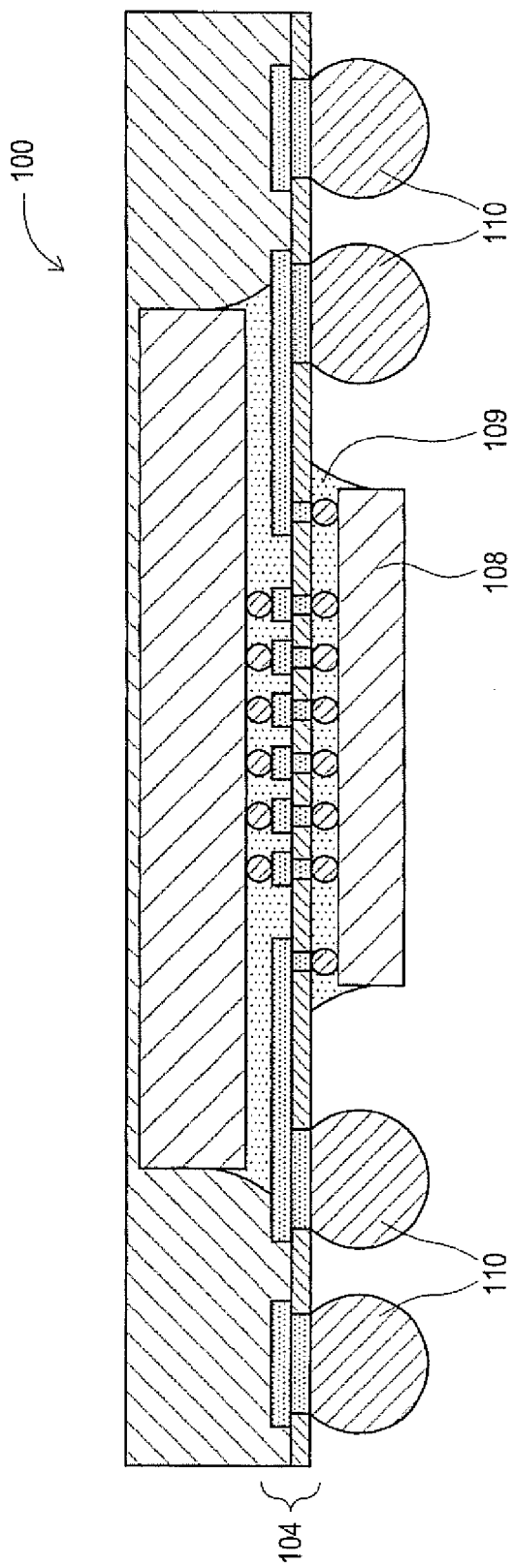
FIG. 46 is a cross-section diagram showing a manufacturing process in the related art.

As shown in FIG. 42, solder balls 76 are mounted on the exposed surface of posts 74. Then, the stacked-type semiconductor package 3 is completed by dicing the wafer into individual packages.

According to the present embodiment, a plurality of semiconductor chips 20a through 20c can be stacked on one side of the insulating layer 11 to further form posts 74 upward in the stacking direction. As a result, there is no need to form wirings, such as wirings 13 described herein, which penetrate the insulating layer 11 and extend to the lower surface of the insulating layer 11. In other words, the insulating layer 11 has the role of serving as a support body for semiconductor chips 20a through 20c. As a result, the number of wiring processes as well as the time associated with these processes can be reduced.

It is noted that the invention is not limited to the particular embodiments shown herein and various changes and modifications are made to the disclosed embodiments without departing from the spirit and scope of the invention. For example, in various embodiments, an example was given of the case that two stacked-type semiconductor packages are manufactured at the same time at a wafer level. However, more than two stacked-type semiconductor packages can be manufactured at the same time at a wafer level.

It is pointed out that in accordance with various embodiments of the invention, the photoresist layer 42 serves as one example of a first photoresist layer, photoresist layer 24 serves an example of a second photoresist layer, photoresist layer 15 serves as one example of a third photoresist layer, photoresist layer 72 serves as one example of a fourth photoresist layer, opening portions 43 and opening portions 63 serve as one example of first opening portions, protective film 22 serves as one example of a first protective film, through holes 53 serve as one example of first through holes, through holes 12 serve as one example of second through holes, protective film 54 serves as one example of a second protective film, posts 74 serve as one example of lead-out wirings, and opening portions 73 serve as one example of third opening portions, respectively.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention can be construed according to the Claims and their equivalents.

What is claimed is:

1. A method comprising:
   forming an insulating layer on and in contact with a wafer;
   after the forming of the insulating layer, forming fan-out wirings on the insulating layer;
   after the forming of the fan-out wirings, stacking a plurality of semiconductor chips on the fan-out wirings using adhesive between each of the plurality of semiconductor chips and the insulating layer;
   after the stacking of the plurality of semiconductor chips, electrically connecting electrodes of the plurality of semiconductor chips to the fan-out wirings;
   after the electrically connecting of the electrodes, the insulating layer comprising the formed on fan-out wirings is free of an electrical conductor in the insulating layer; and
   after the electrically connecting of the electrodes, removing the wafer.

2. The method of claim 1, further comprising:
   resin-sealing the semiconductor chips stacked on the fan-out wirings.

3. The method of claim 2, wherein said electrically connecting comprises:
   forming a seed metal layer over the plurality of semiconductor chips stacked on the fan-out wirings;
   forming a photoresist layer over the seed metal layer and the plurality of semiconductor chips stacked on the fan-out wirings;
   forming an opening portion within the photoresist layer that extends beyond the electrodes of the plurality of semiconductor chips;
   forming metal wiring inside the opening portion; and
   removing the first photoresist layer.

4. The method of claim 2, wherein:
   the electrodes serve as side-wall electrodes and have side surfaces that are coplanar with side surfaces of the semiconductor chips.

5. The method of claim 2, wherein the forming the fan-out wirings comprises:
   forming a seed metal layer on a surface of the insulating layer;
   after the forming of the seed metal layer, forming a photoresist layer on the surface of the insulating layer; and
   removing the photoresist layer at regions.

6. The method of claim 1, further comprising:
   forming a lead-out wiring above the plurality of semiconductor chips.

7. The method of claim 6, wherein the forming the lead-out wiring comprises:
   forming a seed metal layer over the plurality of semiconductor chips stacked on the fan-out wirings;
   forming a photoresist layer over the seed metal layer and the plurality of semiconductor chips stacked on the fan-out wirings;
   forming an opening portion within the photoresist layer that extend from an upper surface of said photoresist layer to an upper surface of the seed metal layer; and
   forming the lead-out wiring inside the opening portion.

8. The method of claim 7, further comprising:
   forming a resin layer over the lead-out wiring and the plurality of semiconductor chips stacked on the fan-out wirings; and
   thinning the resin layer until the uppermost surface of the lead-out wiring is exposed.

9. The method of claim 1, wherein said electrically connecting comprises:
   forming a seed metal layer over the semiconductor chips stacked on the fan-out wirings;
   forming a photoresist layer over the seed metal layer and the plurality of semiconductor chips stacked on the fan-out wirings;
   forming an opening portion within the photoresist layer that extends beyond the electrodes of the plurality of semiconductor chips;
   forming metal wiring inside the opening portion; and
   removing the first photoresist layer.

10. The method of claim 1, wherein:
    the electrodes serve as side-wall electrodes and have side surfaces that are coplanar with side surfaces of the semiconductor chips.

11. The method of claim 1, wherein:
    the electrodes serve as side-wall electrodes and have side surfaces that are coplanar with side surfaces of the semiconductor chips; and
    the forming the side-wall electrodes comprises:
       forming a first protective film at portions on an upper surface of the semiconductor chips other than portions where pads are formed;
       forming a seed metal layer on an upper surface of the semiconductor chips;
    forming a second photoresist layer on the upper surface of the semiconductor chips;
       removing from the second photoresist layer regions in which one surface is coplanar with a side surface of the semiconductor chips and in which the pads exist downward in a stacking direction;
       forming the side-wall electrodes in said regions;
       removing the second photoresist layer; and
       removing portions of the seed metal layer.

12. The method of claim 1, wherein the forming the fan-out wirings comprises:
    forming a seed metal layer on a surface of the insulating layer;

after the forming of the seed metal layer, forming a photoresist layer on the insulating layer; and removing the photoresist layer at regions.

13. A method comprising:

forming an insulating layer on and in contact with a wafer;

after the forming of the insulating layer, forming fan-out wirings on the insulating layer;

after the forming of the fan-out wirings, stacking a plurality of semiconductor chips on the fan-out wirings using adhesive between each of the plurality of semiconductor chips and the insulating layer;

after the stacking of the plurality of semiconductor chips, electrically connecting electrodes of the plurality of semiconductor chips to the fan-out wirings;

after the electrically connecting of the electrodes, the insulating layer comprising the formed on fan-out wirings is free of a through hole and an electrical conductor in the insulating layer;

after the electrically connecting of the electrodes, forming lead-out wirings above the plurality of semiconductor chips; and removing the wafer.

14. The method of claim 13, wherein the forming the lead-out wirings comprises:

forming a seed metal layer over the plurality of semiconductor chips stacked on the fan-out wirings;

forming a photoresist layer over the seed metal layer and the plurality of semiconductor chips stacked on the fan-out wirings;

forming opening portions within the photoresist layer that extend from an upper surface of said photoresist layer to an upper surface of the seed metal layer;

forming the lead-out wirings inside the opening portions;

removing the photoresist layer; and removing portions of the seed metal layer.

15. The method of claim 14, further comprising:

forming a resin layer over the lead-out wirings and the plurality of semiconductor chips stacked on the fan-out wirings; and thinning the resin layer until the uppermost surfaces of the lead-out wirings are exposed.

16. The method of claim 13, further comprising:

resin-sealing the semiconductor chips stacked on the fan-out wirings.

17. The method of claim 16, wherein:

the electrodes serve as side-wall electrodes and have side surfaces that are coplanar with side surfaces of the semiconductor chips.

18. The method of claim 13, further comprising:

forming a lead-out wiring above the plurality of semiconductor chips.

19. The method of claim 13, wherein:

the electrodes serve as side-wall electrodes and have side surfaces that are coplanar with side surfaces of the semiconductor chips.

20. The method of claim 13, wherein the forming the fan-out wirings comprises:

forming a seed metal layer on a surface of the insulating layer;

after the forming of the seed metal layer, forming a photoresist layer on the insulating layer; and removing the photoresist layer at regions.

* * * * *